United States Patent
Chang et al.

(10) Patent No.: US 7,830,203 B2
(45) Date of Patent: Nov. 9, 2010

(54) SYSTEM-ON-A-CHIP AND POWER GATING CIRCUIT THEREOF

(75) Inventors: Chung-Yu Chang, Hsinchu (TW); Ching-Ji Huang, Kaohsiung County (TW)

(73) Assignee: Industrial Technology Research Institute, Hsinchu (TW)

( * ) Notice: Subject to any disclaimer, the term of this patent is extended or adjusted under 35 U.S.C. 154(b) by 68 days.

(21) Appl. No.: 11/964,012

(22) Filed: Dec. 25, 2007

(65) Prior Publication Data

US 2009/0091372 A1    Apr. 9, 2009

(30) Foreign Application Priority Data

Oct. 5, 2007    (TW) ............................... 96137467 A

(51) Int. Cl.
    *G05F 3/02* (2006.01)
(52) U.S. Cl. .................. 327/544; 327/534; 327/537
(58) Field of Classification Search ......... 327/108–112, 327/534, 535, 536, 537, 434
    See application file for complete search history.

(56) References Cited

U.S. PATENT DOCUMENTS

| | | | | |
|---|---|---|---|---|
| 4,633,101 | A | * | 12/1986 | Masuda et al. ............... 327/93 |
| 5,821,769 | A | | 10/1998 | Douseki |
| 5,969,564 | A | * | 10/1999 | Komatsu et al. ............ 327/534 |
| 6,118,328 | A | | 9/2000 | Morikawa |
| 6,288,582 | B1 | * | 9/2001 | Shigehara ................... 327/112 |
| 6,784,726 | B2 | | 8/2004 | Burr | 
| 6,876,252 | B2 | | 4/2005 | Kim et al. |
| 7,495,506 | B1 | * | 2/2009 | Carper ........................ 327/540 |
| 2004/0046603 | A1 | * | 3/2004 | Bedarida et al. ............ 327/536 |
| 2006/0208787 | A1 | * | 9/2006 | Callahan, Jr. ................ 327/404 |
| 2007/0159239 | A1 | * | 7/2007 | Rhee .......................... 327/544 |

OTHER PUBLICATIONS

Article titled "New Power Gating Structure with Low Voltage Fluctuations by Bulk Controller in Trasnition Mode" authored by Chang et al., 2007 IEEE International Symposium on Circuits and Systems (pp. 3740-3743).

Article titled "Minimizing inductive noise in system-on-a-chip with multiple power gating structures" authored by Kim et al., in Proc. of the European Solid-State Circuit Conference, (pp. 635-638) Sep. 2003.

(Continued)

*Primary Examiner*—Lincoln Donovan
*Assistant Examiner*—Shikha Goyal
(74) *Attorney, Agent, or Firm*—Jianq Chyun IP Office

(57) ABSTRACT

A system-on-a-chip and a power gating circuit thereof are provided. The power gating circuit includes a first transistor, a charge pump circuit, and a hold circuit. A gate terminal of the first transistor is controlled by a first input signal. A first source/drain terminal of the first transistor is coupled to a first voltage. A second source/drain terminal of the first transistor outputs an output voltage. The charge pump circuit is coupled to a bulk terminal of the first transistor for changing a bulk voltage of the first transistor according to a second input signal. The hold circuit is coupled to the bulk terminal of the first transistor for holding the bulk voltage of the first transistor.

16 Claims, 20 Drawing Sheets

OTHER PUBLICATIONS

Article titled "Design method of MTCMOS power switch for low-voltage high speed LSIs" authored by Mutoh et al., in Asia and South Pacific Design Automation Conference, (pp. 113-116) 1999.

Article titled "Analysis and optimization of gate leakage current of power gating circuits" authored by Kim et al., in Proc. of Asia and South Pacific Conference on Design Automation, (pp. 24-27) Jan. 2006.

Article titled "Understanding and minimizing ground bounce during mode transition of power gating structures" authored by Kim et al., in Proc. of the 29th European Solid-State Circuits Conference, (pp. 22-25) Aug. 2003.

Article titled "Experimental Measurement of A Novel Power Gating Structure with Intermediate Power Saving Mode" authored by Kim et al., in Proc. of the 2004 International Symposium on Low Power Electronics and Design, (pp. 20-25) Aug. 2004.

Article titled "Benefits and costs of power-gating technique" authored by Jiang et al., in Proc. of 2005 IEEE International Conference on VLSI in Computers and Processors, (pp. 559-566) Oct. 2005.

* cited by examiner ated power required by a function block 120. Therefore, the system may selectively shut down the function block 120 to reduce the power consumption of the system. However, in FIG. 1, the gate voltage of each PMOS transistor will generate a large transient current during the transition (e.g., changing from a high voltage level to a low voltage level), and the self-inductance generated by the large transient current flowing through the bonding wires and the parasitic inductance in the chip will cause voltage fluctuation of the source line in the chip. If the amplitude of the voltage fluctuation is great, the internal circuit of the function block 120 is often locked at a wrong value, or the circuit transit at a wrong time point, leading to error actions of the function block 120.

SYSTEM-ON-A-CHIP AND POWER GATING CIRCUIT THEREOF

CROSS-REFERENCE TO RELATED APPLICATION

This application claims the priority benefit of Taiwan application serial no. 96137467, filed on Oct. 5, 2007. The entirety of the above-mentioned patent application is hereby incorporated by reference herein and made a part of this specification.

BACKGROUND OF THE INVENTION

1. Field of the Invention

The present invention relates to a system-on-a-chip and a power gating circuit thereof.

2. Description of Related Art

Currently, the system-on-a-chip (SOC) applied in telecommunication products or computers is developing in the trend of high performance and portability, so its power consumption has become an important consideration in design. The most effective way to reduce the power consumption of a circuit is to reduce the operating voltage of the circuit. However, if the operating voltage is lowered, the overall performance of the circuit will be lowered accordingly. Therefore, in order to maintain the overall performance of the circuit, threshold voltages of transistors must be lowered, which will lead to an indexed growth of the sub-threshold leakage current.

FIG. 1 is an architectural view showing the architecture of a conventional power gating circuit. In FIG. 1, a plurality of P-type metal oxide semiconductor (PMOS) transistors is used to accomplish the power gating circuit. Through the control of an input signal VS, a system voltage VDD may be determined whether or not to pass through the power gating circuit to serve as an output voltage VVDD, so as to provide the operating power required by a function block 120. Therefore, the system may selectively shut down the function block 120 to reduce the power consumption of the system. However, in FIG. 1, the gate voltage of each PMOS transistor will generate a large transient current during the transition (e.g., changing from a high voltage level to a low voltage level), and the self-inductance generated by the large transient current flowing through the bonding wires and the parasitic inductance in the chip will cause voltage fluctuation of the source line in the chip. If the amplitude of the voltage fluctuation is great, the internal circuit of the function block 120 is often locked at a wrong value, or the circuit transit at a wrong time point, leading to error actions of the function block 120.

In order to solve the problem of voltage fluctuation of the power gating circuit, the following solution is provided. FIG. 2 is a schematic view of a power gating circuit of U.S. Pat. No. 6,876,252B2. Referring to FIG. 2, a plurality of PMOS transistors and a plurality of delayers 210 are used to accomplish the power gating circuit. Firstly, the width-to-length ratio (W/L) of each transistor is designed to be 1/n of the original value. Thus, when the transistors are in the operating state, the output current is 1/n of the original value, i.e., the output current becomes smaller. The power gating circuit has a delayer 210 between the gate terminals of every two transistors, such that the transistors are conducted step by step. Thus, the transistors will not be all conducted at the same time, so as to restrict the transient current of the power gating circuit and reduce the amplitude of voltage fluctuation. However, though the power gating circuit reduces the transient current by conducting the transistors step by step, all the transistors are fully on when being conducted, so the transient current of the power gating circuit is still quite large.

FIG. 3 is a schematic view of a power gating circuit published in Minimizing inductive noise in system-on-a-chip with multiple power gating structures (Proc. of the European Solid-State Circuit Conference, pp. 635-638, September 2003) by Suhwan Kim et al. Referring to FIG. 3, the power gating circuit makes the transistor 310 to enter the operating state slowly by controlling, i.e., gradually reducing the gate voltage of the control transistor 310, such that the transistor 310 generates a small transient current in the operating state. Thus, the voltage fluctuation of the function block 320 is alleviated. However, though the power gating circuit can suppress the voltage fluctuation, the circuit structure is too complicated.

SUMMARY OF THE INVENTION

The present invention is directed to a power gating circuit capable of reducing a transient current generated by the power gating circuit.

The present invention is also directed to a system-on-a-chip (SOC) capable of reducing a transient current generated by a power gating circuit, thus alleviating voltage fluctuation of the SOC.

The present invention provides a power gating circuit. The power gating circuit includes a first transistor, a charge pump circuit, and a hold circuit. A gate terminal of the first transistor is controlled by a first input signal. A first source/drain terminal of the first transistor is coupled to a first voltage. A second source/drain terminal of the first transistor outputs an output voltage. The charge pump circuit is coupled to a bulk terminal of the first transistor for changing a bulk voltage of the first transistor according to a second input signal. The hold circuit is coupled to the bulk terminal of the first transistor for holding the bulk voltage of the first transistor.

The present invention provides an SOC. The SOC includes a logic circuit and a power gating circuit. The logic circuit has a power terminal for receiving power required for the logic circuit to operate. The power gating circuit includes a first transistor, a charge pump circuit, and a hold circuit. A gate terminal of the first transistor is controlled by a first input signal. A first source/drain terminal of the first transistor is coupled to a first voltage. A second source/drain terminal of the first transistor is coupled to a power terminal of the logic circuit. The charge pump circuit is coupled to a bulk terminal of the first transistor for changing a bulk voltage of the first transistor according to a second input signal. The hold circuit is coupled to the bulk terminal of the first transistor for holding the bulk voltage of the first transistor.

The present invention uses the charge pump circuit to change the bulk voltage of the first transistor of the power gating circuit, so as to modulate a threshold voltage of the first transistor to reduce the transient current when the transistor is conducted by increasing the threshold voltage, and further to suppress the voltage fluctuation of the entire SOC. The hold circuit restores the threshold voltage of the first transistor to a normal value at a predetermined rate, such that the power gating circuit when restoring the normal operating state may provide larger current, and the entire SOC may operate normally. Therefore, the present invention may prevent error actions of the entire SOC caused by an over large transient current.

In order to make the aforementioned features and advantages of the present invention comprehensible, preferred embodiments accompanied with figures are described in detail below.

DESCRIPTION OF EMBODIMENTS

Figure 4:
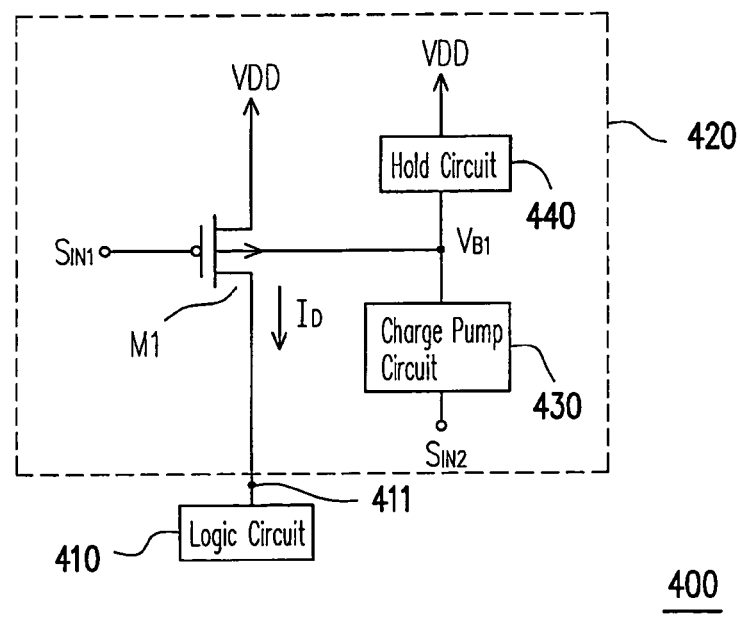
FIG. 4 is a block diagram of an SOC according to an embodiment of the present invention.

FIG. 4 is a block diagram of an SOC according to an embodiment of the present invention. Referring to FIG. 4, the SOC 400 includes a logic circuit 410 and a power gating circuit 420. The logic circuit 410 has a power terminal 411 for receiving power required for the logic circuit 410 to operate. Through the control of a first input signal $S_{IN1}$, a first voltage (e.g., a system voltage VDD) is determined whether or not to pass through the power gating circuit 420 to serve as an output voltage, so as to provide the operating power required by the logic circuit 410. Therefore, the SOC 400 can selectively turn off the logic circuit 410, so as to reduce the power consumption of the SOC 400.

The power gating circuit 420 includes a first transistor M1, a charge pump circuit 430, and a hold circuit 440. In this embodiment, the first transistor M1, for example, is a PMOS transistor. A first source/drain terminal of the first transistor M1 is coupled to the first voltage (e.g., the system voltage VDD). The first transistor M1 whose gate terminal is controlled by the state of the first input signal $S_{IN1}$, (e.g., a logic high voltage level or a logic low voltage level) provides an output voltage to the power terminal 411 of the logic circuit 410 at a second source/drain terminal of the first transistor M1, so as to provide the power required for the logic circuit 410 to operate.

A charge pump circuit 430 is coupled to a bulk terminal of the first transistor M1, and changes a bulk voltage $V_{B1}$ of the first transistor M1 (e.g., rises the bulk voltage $V_{B1}$ of the first transistor M1) according to the state of a second input signal $S_{IN2}$. The hold circuit 440 is coupled to the bulk terminal of the first transistor M1 for holding the bulk voltage $V_{B1}$ of the first transistor M1. A threshold voltage of the first transistor M1 may be adjusted through the architecture of the power gating circuit 420, so as to reduce the transient current when the first transistor M1 is conducted, and further to suppress the voltage fluctuation of the SOC 400.

Figure 5A:
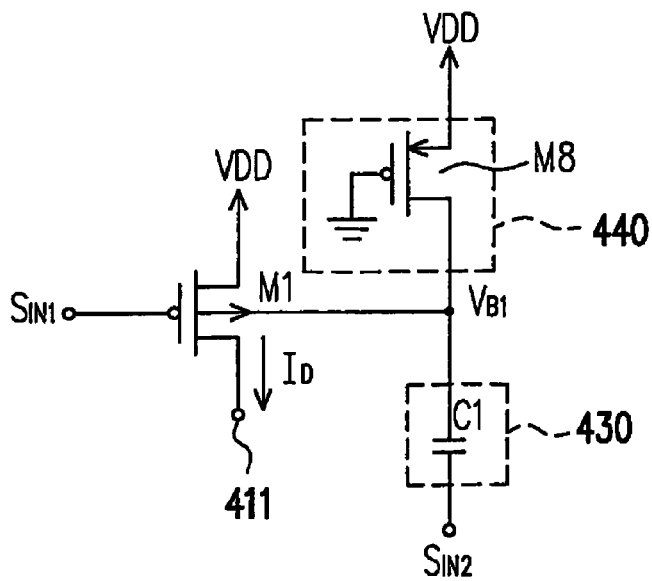
FIG. 5A is a circuit diagram of the power gating circuit of FIG. 4.

FIG. 5A is a circuit diagram of the power gating circuit 420 of FIG. 4. Referring to FIG. 5A, the charge pump circuit 430 includes a capacitor C1. A first terminal and a second terminal of the capacitor C1 are coupled to the second input signal $S_{IN2}$ and the bulk terminal of the first transistor M1. In this embodiment, the second input signal $S_{IN2}$ and the first input signal $S_{IN1}$, for example, provide different voltage levels and phases (i.e., if the first input signal $S_{IN1}$, is at the logic high voltage level, then the second input signal $S_{IN2}$ is at the logic low voltage level; if the first input signal $S_{IN1}$, is at the logic low voltage level, then the second input signal $S_{IN2}$ is at the logic high voltage level). In addition, the capacitor C1, for example, is a MOS capacitor, a metal insulator metal (MIM) capacitor, or a sandwich capacitor, and is not limited herein.

Figure 5B:
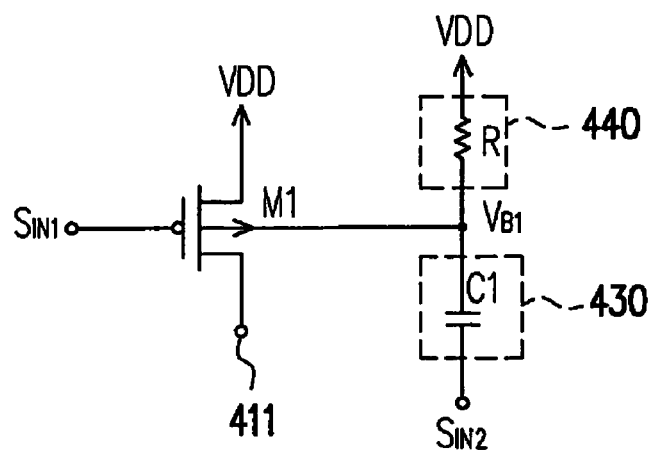
FIG. 5B is a circuit diagram of another embodiment of FIG. 5A.

The hold circuit 440 includes an second transistor M8. A gate terminal of the second transistor M8 is coupled to a fourth voltage (e.g., a ground voltage GND), and a first source/drain terminal of the second transistor M8 is coupled to the first voltage (e.g., the system voltage VDD). Thus, the second transistor M8 is constantly in the conducted state, for holding the bulk voltage $V_{B1}$ of the first transistor M1 at around the voltage level of the first voltage. In this embodiment, the second transistor M8, for example, is a PMOS transistor. Moreover, in another embodiment of the present invention, the hold circuit 440 may be implemented by an impedor, as shown in FIG. 5B, which can also achieve the above effect. A first terminal of the impedor is coupled to the first voltage (e.g., the system voltage VDD), and a second terminal of the impedor is coupled to the bulk terminal of the first transistor M1. In this embodiment, the impedor, for example, is a resistor R.

Hereinafter, the operating process of the power gating circuit 420 will be described. Firstly, the first input signal $S_{IN1}$ at the logic high voltage level (e.g., the level of the system voltage VDD) is input to the gate terminal of the first transistor M1, and the second input signal $S_{IN2}$ at the logic low voltage level (e.g., the level of the ground voltage GND) is input to the first terminal of the capacitor C1. As the first input signal $S_{IN1}$, is at the logic high voltage level, the first transistor M1 is not conducted. In other words, the supply of the operating power required by the logic circuit 410 is halted (i.e., the logic circuit 410 enters its sleep state). In another aspect, as the first terminal of the capacitor C1 is at the logic low voltage level, the system voltage VDD will charge the capacitor C1 through the hold circuit 440, such that the voltage difference between two terminals of the capacitor C1 is approximately the system voltage VDD. At this time, the hold circuit 440 may hold the bulk voltage $V_{B1}$ of the first transistor M1 at around the voltage level of the first voltage (the system voltage VDD).

If the first input signal $S_{IN1}$, transits to the logic low voltage level (e.g., the ground level GND), the first transistor M1 will be conducted. That is, the power required for the logic circuit 410 to operate will be provided (i.e., the logic circuit 410 enters a normal operating state from the sleep state). In another aspect, the second input signal $S_{IN2}$ transits to the logic high voltage level (e.g., the system voltage VDD). At this time, the voltage difference between two terminals of the capacitor C1 is approximately the system voltage VDD, and the voltage level of the second input signal $S_{IN2}$ is VDD. Therefore, the bulk voltage $V_{B1}$ of the first transistor M1 will be boosted to about 2*VDD. As the bulk voltage $V_{B1}$ of the first transistor M1 is about 2*VDD, and the first source/drain voltage of the first transistor M1 is the first voltage (the system voltage VDD), the first transistor will be affected by the body effect, leading to the change of the threshold voltage of the first transistor M1. The threshold voltage $V_{TH}$ of the first transistor M1 may be described as the equation below:

$$V_{TH}=V_{TH0}+\gamma(\sqrt{|2\phi_F+V_{BS}|}-\sqrt{|2\phi_F|}) \quad (1)$$

where $V_{TH}$ is the threshold voltage of the first transistor M1, $V_{TH0}$ is the threshold voltage when no level difference is between the bulk and source of the first transistor M1, γ is the body effect parameter of the first transistor M1, and $\phi_F$ is a parameter relevant to energy levels of semiconductor. It is known from equation (1) that when the bulk-source voltage $V_{BS}$ of the first transistor M1 is high, the threshold voltage $V_{TH}$ of the first transistor M1 will be high accordingly. On the contrary, when the bulk-source voltage $V_{SB}$ of the first transistor M1 is low, the threshold voltage $V_{TH}$ of the first transistor M1 will be low accordingly. In addition, if the levels of the bulk and the source of the first transistor M1 are the same, i.e., if $V_{SB}=0$, then $V_{TH}=V_{TH0}$. Therefore, by controlling the bulk-source voltage $V_{BS}$ of the first transistor M1, the threshold voltage $V_{TH}$ of the first transistor M1 may be adjusted. In addition, when the threshold voltage $V_{TH}$ of the first transistor M1 is changed, the output current $I_D$ when the first transistor M1 is conducted will be changed accordingly. When the first transistor M1 is in the operating state, the generated current $I_D$ is expressed as the following equation:

$$I_D = \mu C_{ox} \frac{W}{L}\left[(V_{GS}-V_{TH})V_{DS} - \frac{1}{2}V_{DS}^2\right] \quad (2)$$

where μ is the carrier mobility, $C_{ox}$ is the unit capacitance of the gate oxide layer, W is the gate width of the first transistor M1, and L is the gate length of the first transistor M1. Firstly, provided that μ, $C_{ox}$, W/L, $V_{GS}$ and $V_{DS}$ of the first transistor M1 remain unchanged, when the threshold voltage $V_{TH}$ of the first transistor M1 is high, the output current $I_D$ of the first transistor M1 is small. On the contrary, if the threshold voltage $V_{TH}$ of the first transistor M1 is low, the output current $I_D$ of the first transistor M1 becomes large. Therefore, the threshold voltage $V_{TH}$ of the first transistor M1 may be changed by adjusting the bulk-source voltage $V_{BS}$ of the first transistor M1, thus controlling the output current $I_D$ of the first transistor M1.

As described above, when the first transistor M1 is just conducted, the bulk voltage $V_{B1}$ (about 2*VDD) of the first transistor M1 is higher than the first source/drain voltage (VDD). Therefore, the bulk-source voltage $V_{BS}$ of the first transistor M1 is about VDD, and the threshold voltage $V_{TH}$ of the first transistor M1 rises, such that the output current $I_D$ when the first transistor M1 is conducted is small. Then, the hold circuit 440 discharges, such that the bulk voltage $V_{B1}$ of the first transistor M1 gradually approaches the voltage level of the first voltage at a predetermined rate. When the bulk voltage $V_{B1}$ of the first transistor M1 gradually decreases, the conducting current of the first transistor M1 will become greater gradually until the bulk voltage $V_{B1}$ of the first transistor M1 recovers to about VDD. Thus, this embodiment can effectively reduce the transient current generated by the power gating circuit 420, so as to suppress the voltage fluctuation of the logic circuit 410, such the SOC 400 does not have error actions.

Figure 6:
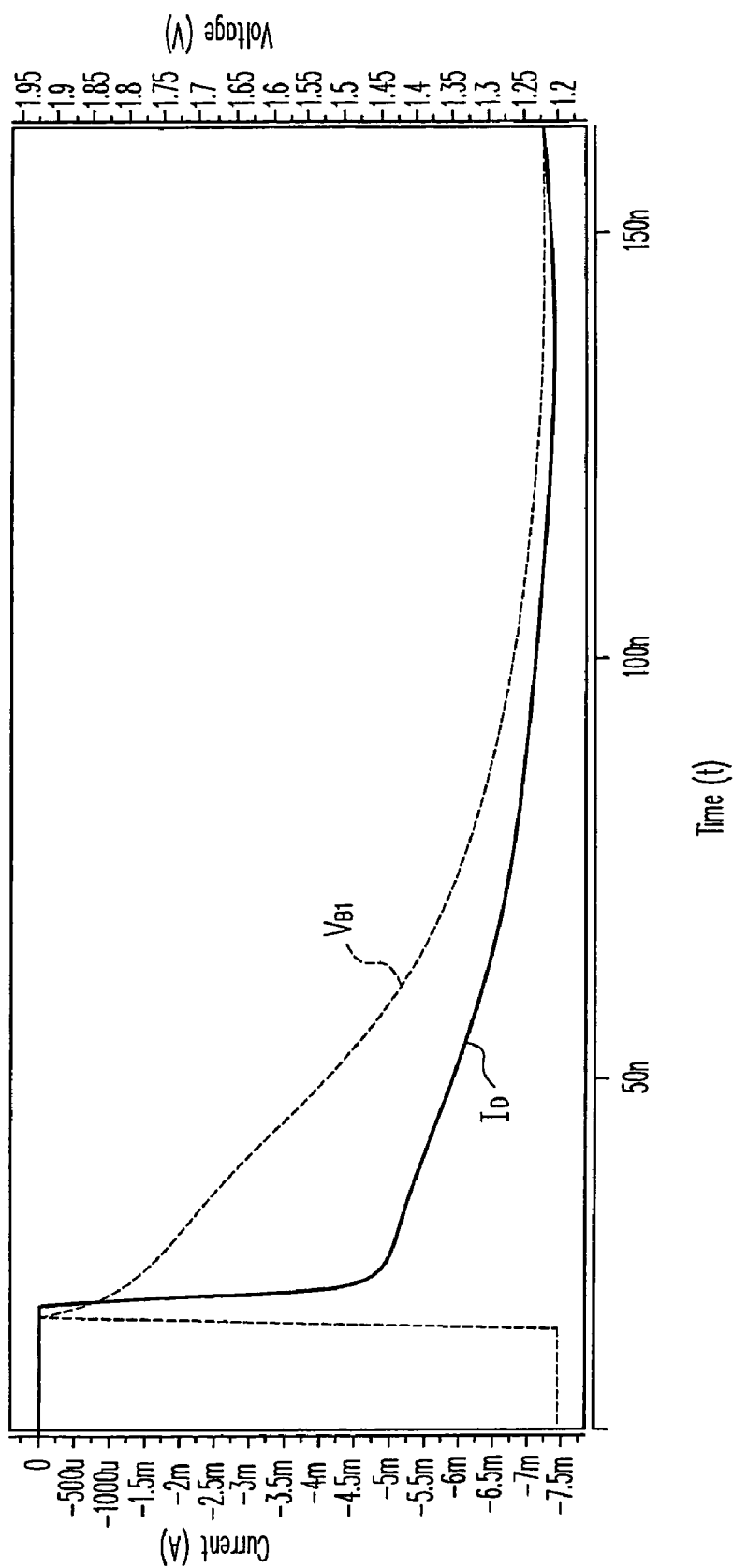
FIG. 6 is a diagram showing a relationship between the bulk voltage of the first transistor and the current according to an embodiment of the present invention.

Next, simulation results will be given to prove the results described in this embodiment. FIG. 6 is a diagram showing a relationship between the bulk voltage $V_{B1}$ of the first transistor M1 and the current $I_D$ according to an embodiment of the present invention. It is known from FIG. 6 that when the first transistor M1 is just conducted, the bulk voltage $V_{B1}$ of the first transistor M1 will be boosted to a higher level (e.g., about 1.8V listed in Table 1), such that the threshold voltage $V_{TH}$ of the first transistor M1 becomes higher (e.g., about 674 mV listed in Table 1), such that the output current $I_D$ of the first transistor M1 becomes smaller (e.g., about 4.83 mA listed in Table 1). After that, as the hold circuit 440 discharges the bulk voltage $V_{B1}$ of the first transistor M1, the bulk voltage $V_{B1}$ of the first transistor M1 will gradually decrease to the first voltage (e.g., about 1.2 V listed in Table 1), and the threshold voltage $V_{TH}$ of the first transistor M1 will also gradually become lower (e.g., about 501 mV listed in Table 1), such that the output current $I_D$ of the first transistor M1 recovers the normal value (e.g., about 7.51 mA listed in Table 1). In this manner, this embodiment actually reduces the transient current generated by the power gating circuit 420.

TABLE 1

Table of Relationship of Bulk Voltage, Threshold Voltage, and Current of MOS Transistor

| $V_B$ | $V_T$ | Current ($V_{ds} = V_{DD} * 5\%$) | Current ($V_{ds} = V_{DD}$) |
|---|---|---|---|
| 1.8 | 674 mV | 311 uA | 4.83 mA |
| 1.6 | 623 mV | 343 uA | 5.63 mA |
| 1.4 | 566 mV | 380 uA | 6.5 mA |
| 1.2 | 501 mV | 420 uA | 7.51 mA |

Figure 7:
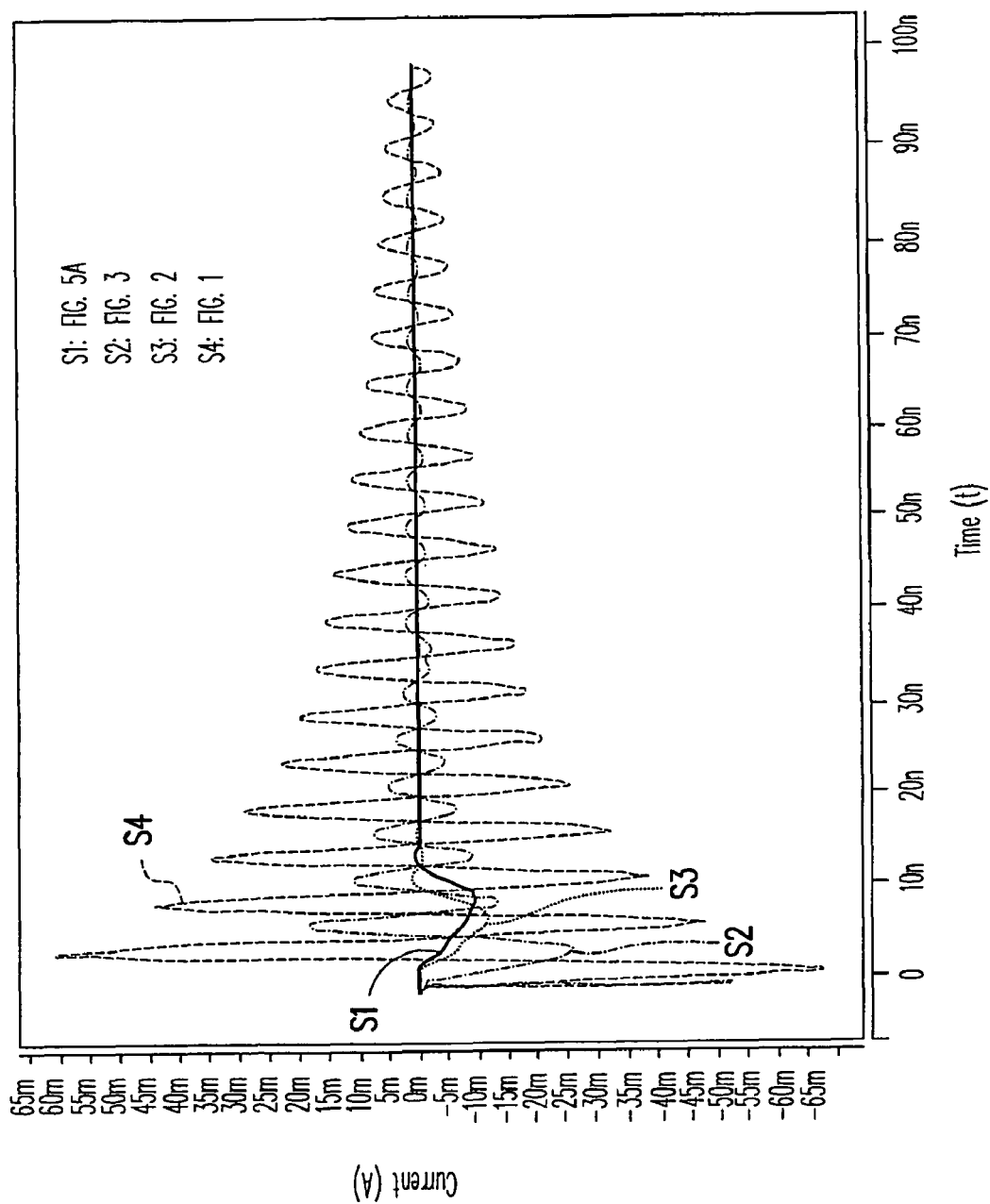
FIG. 7 is a diagram showing wave forms of the current of the power gating circuit of the prior art and the power gating circuit of this embodiment at transitions of the input signal.

Moreover, in order to compare the difference between the power gating circuits of the prior art and this embodiment, the power gating circuits of the prior art and this embodiment are simulated below respectively, and the simulation results are as shown in FIG. 7. FIG. 7 is a diagram showing wave forms of the current of the power gating circuits of the prior art and this embodiment at the transition of the input signal. Referring to FIG. 7, the curve S1 is the wave form of the current output by the power gating circuit 420 of this embodiment. The curve S2 is the wave form of the current output by the power gating circuit of FIG. 3. The curve S3 is the wave form of the current output by the power gating circuit of FIG. 2. The curve S4 is the wave form of the current output by the power gating circuit of FIG. 1. It is known from FIG. 7 that the transient current generated by the power gating circuit 420 of this embodiment is small, and the fluctuation phenomenon is not obvious.

Figure 8:
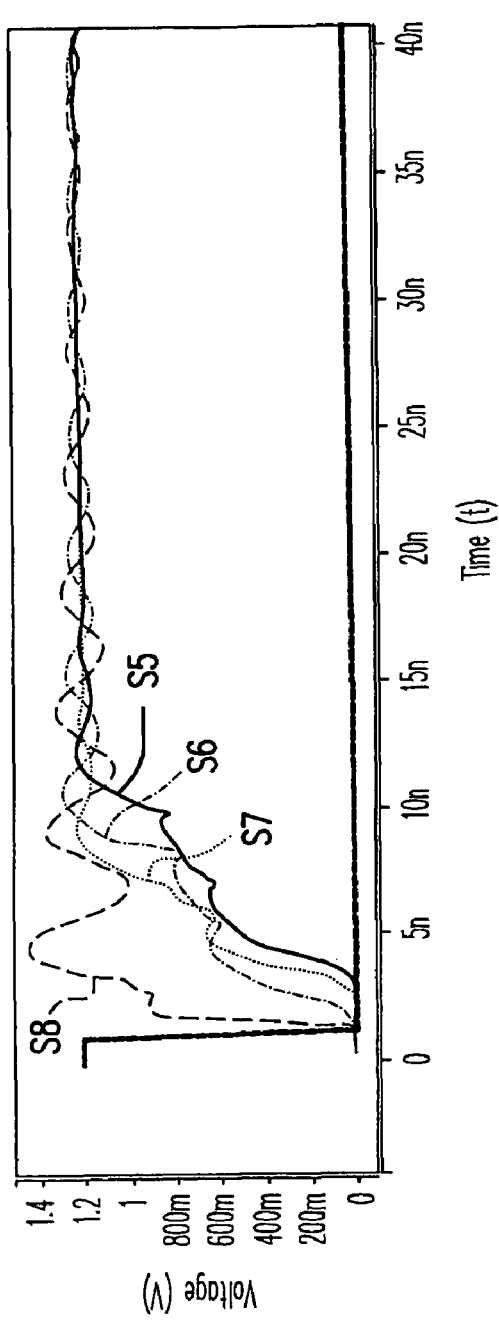
FIG. 8 is a diagram showing wave forms of the power voltage (the output voltage of the power gating circuit) for 512X4 SRAM.

Next, the power gating circuits of the prior art and this embodiment are used as the power gating circuits for providing power to 512X4 Static Random Access Memory (SRAM) and 16X16+40 bits Multiplier-Accumulator (MAC). The wave forms of the output voltage of the power gating circuits at the transition of the input signal and the system voltage of the SOC are simulated. FIG. 8 is a diagram showing wave forms of the power voltage (the output voltage of the power gating circuit) for 512X4 SRAM. In FIG. 8, the curve S5 is the wave form of the output voltage of the power gating circuit 420 of this embodiment. The curve S6 is the wave form of the output voltage of the power gating circuit of FIG. 3. The curve S7 is the wave form of the output voltage of the power gating circuit of FIG. 2. The curve S8 is the wave form of the output voltage of the power gating circuit of FIG. 1.

Figure 9:
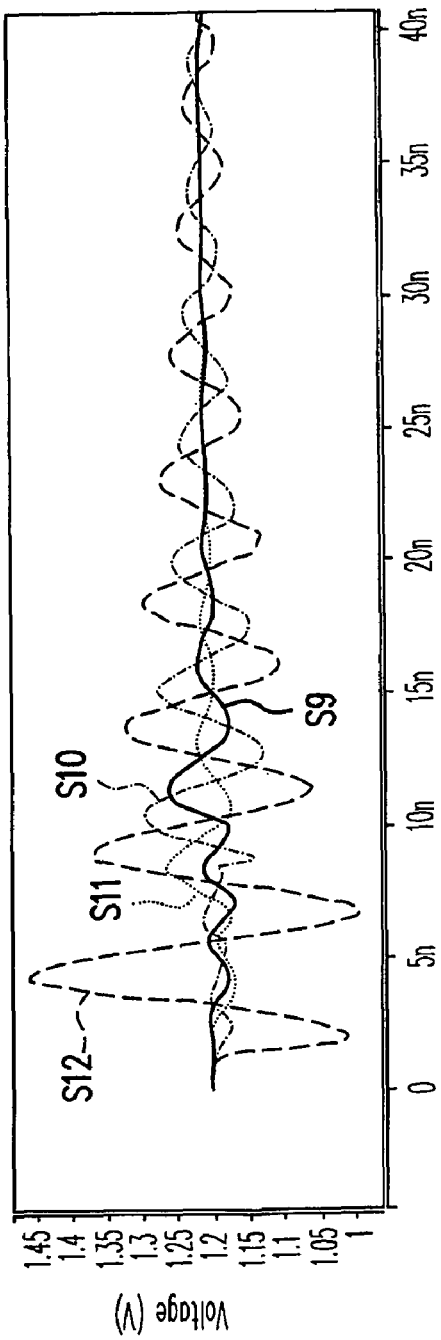
FIG. 9 is a diagram showing wave forms of the system voltage of an SOC using the power gating circuits to control 512X4 SRAM.

FIG. 9 is a diagram showing wave forms of the system voltage VDD of an SOC using the power gating circuits to control 512X4 SRAM. In FIG. 9, the curve S9 is the wave form of the system voltage VDD of the entire SOC 400 of this embodiment. The curve S10 is the wave form of the system voltage VDD of FIG. 3. The curve S11 is the wave form of the system voltage VDD of FIG. 2. The curve S12 is the wave form of the system voltage VDD of FIG. 1.

Figure 10:
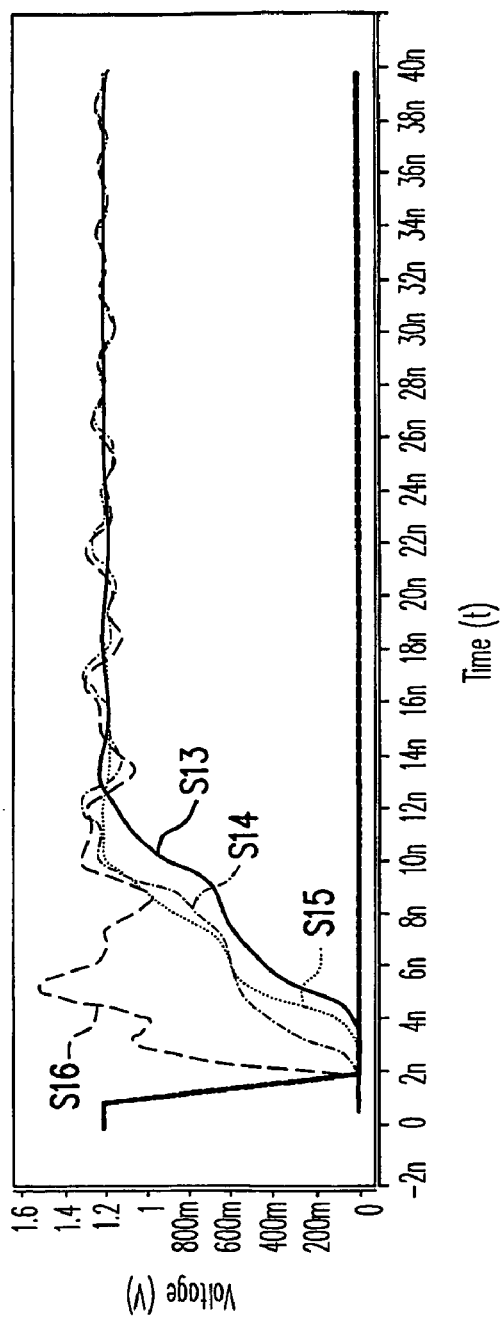
FIG. 10 is a diagram showing wave forms of the power voltage (the output voltage of the power gating circuit) for 16X16+40 bits MAC.

FIG. 10 is a diagram showing wave forms of the power voltage (the output voltage of the power gating circuit) for 16X16+40 bits MAC. In FIG. 10, the curve S13 is the wave form of the output voltage of the power gating circuit 420 of this embodiment. The curve S14 is the wave form of the output voltage of the power gating circuit of FIG. 3. The curve S15 is the wave form of the output voltage of the power gating circuit of FIG. 2. The curve S16 is the wave form of the output voltage of the power gating circuit of FIG. 1.

Figure 11:
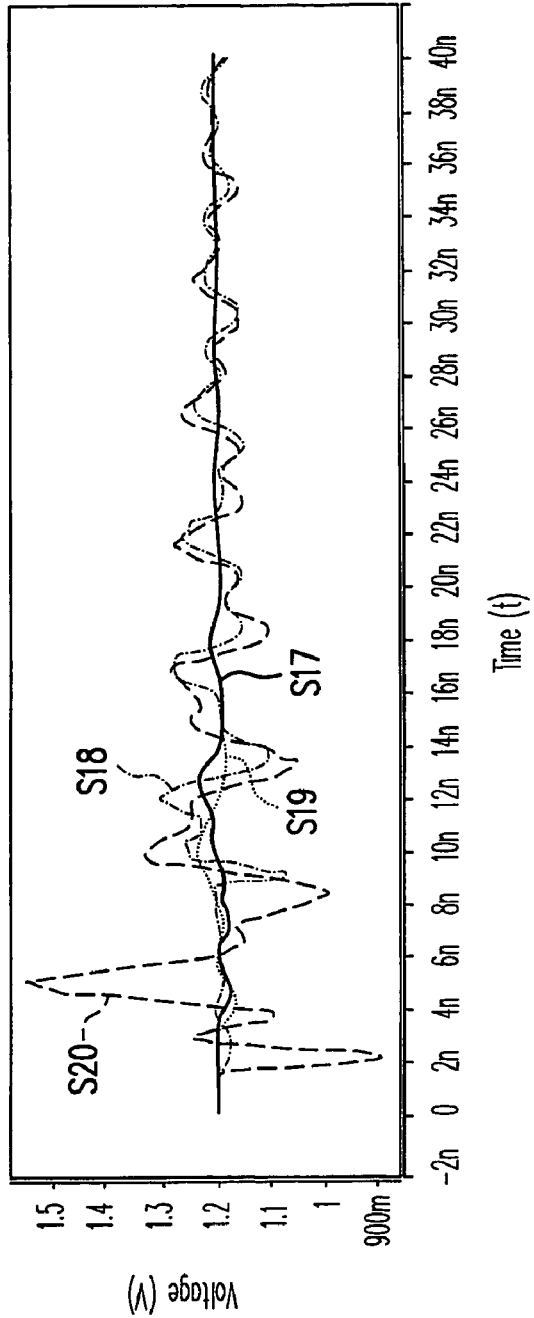
FIG. 11 is a diagram showing wave forms of the system voltage of an SOC using the power gating circuits to control 16X16+40 bits MAC.

FIG. 11 is a diagram showing wave forms of the system voltage VDD of an SOC using the power gating circuits to control 16X16+40 bits MAC. In FIG. 11, the curve S17 is the wave form of the system voltage VDD of the entire SOC 400 of this embodiment. The curve S18 is the wave form of the system voltage VDD of FIG. 3. The curve S19 is the wave form of the system voltage VDD of FIG. 2. The curve S20 is the wave form of the system voltage VDD of FIG. 1.

It is known from the above four diagrams of wave forms (FIGS. 8 to 11) that the fluctuation of the voltage provided by the power gating circuit 420 is moderate, and the system voltage VDD of the entire SOC 400 also has small fluctuation. Then, the fluctuation of the above voltage wave forms is normalized, and the results are as shown in Table 2. It can be observed from Table 2 that the power gating circuit 420 of this embodiment has small voltage fluctuation at the transition of the input signal. Therefore, this embodiment can actually reduce the transient current generated by the power gating circuit, and further suppress the voltage fluctuation of the SOC.

TABLE 2

Normalized Peak-to-Peak Voltages of Power Gating Circuits with SRAM and MAC

Figure 1:
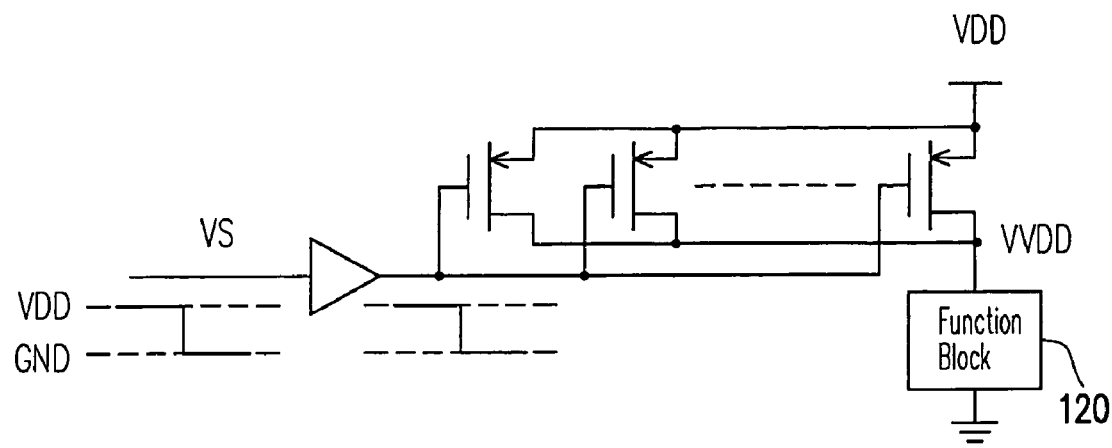
FIG. 1 is an architectural view showing the architecture of a conventional power gating circuit.
Figure 2:
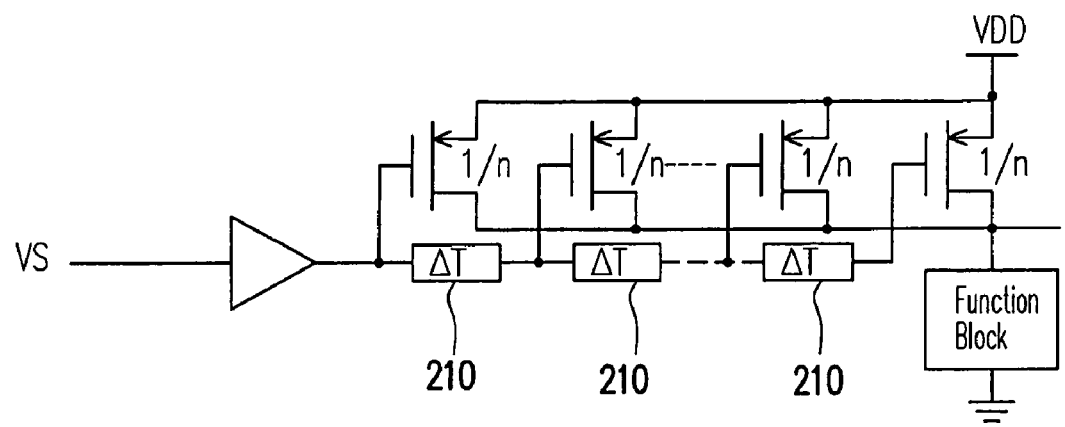
FIG. 2 is a schematic view of a power gating circuit of U.S. Pat. No. 6,876,252B2.
Figure 3:
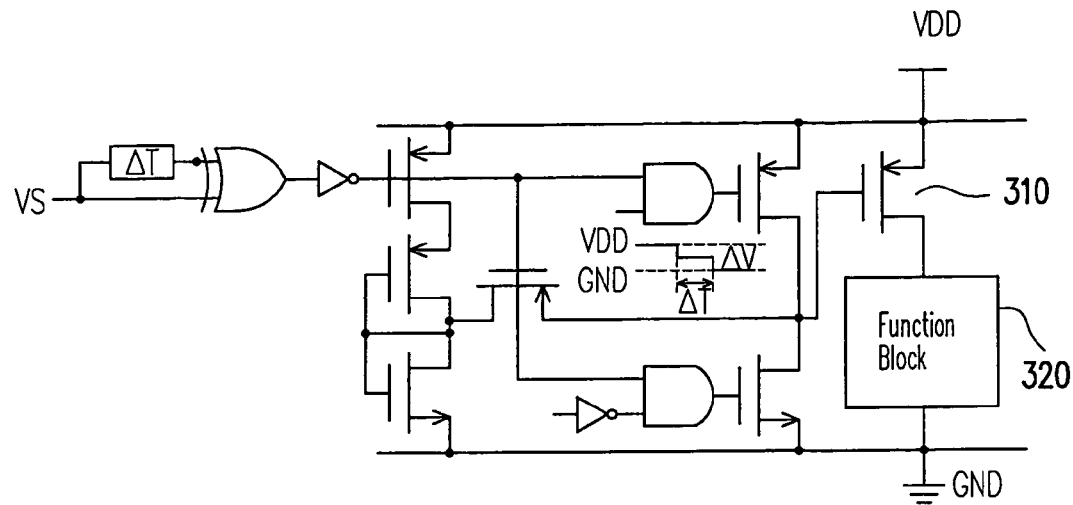
FIG. 3 is a schematic view of a power gating circuit published in Minimizing inductive noise in system-on-a-chip with multiple power gating structures (Proc. of the European Solid-State Circuit Conference, pp. 635-638, September 2003) by Suhwan Kim et al.

| Logic Circuit | | 512X4 SRAM | 16 × 16 + 40 bits MAC |
|---|---|---|---|
| Power gating circuit 420 of this embodiment | VDDp-p | 1 | 1 |
| | GNDp-p | 1 | 1 |
| Power gating circuit of FIG. 1 | VDDp-p | 5.21 | 11.56 |
| | GNDp-p | 5.37 | 9.61 |
| Power gating circuit of FIG. 2 | VDDp-p | 1.1 | 1.42 |
| | GNDp-p | 1.09 | 1.16 |
| Power gating circuit of FIG. 3 | VDDp-p | 1.9 | 4.18 |
| | GNDp-p | 1.98 | 4.27 |

Figure 12A:
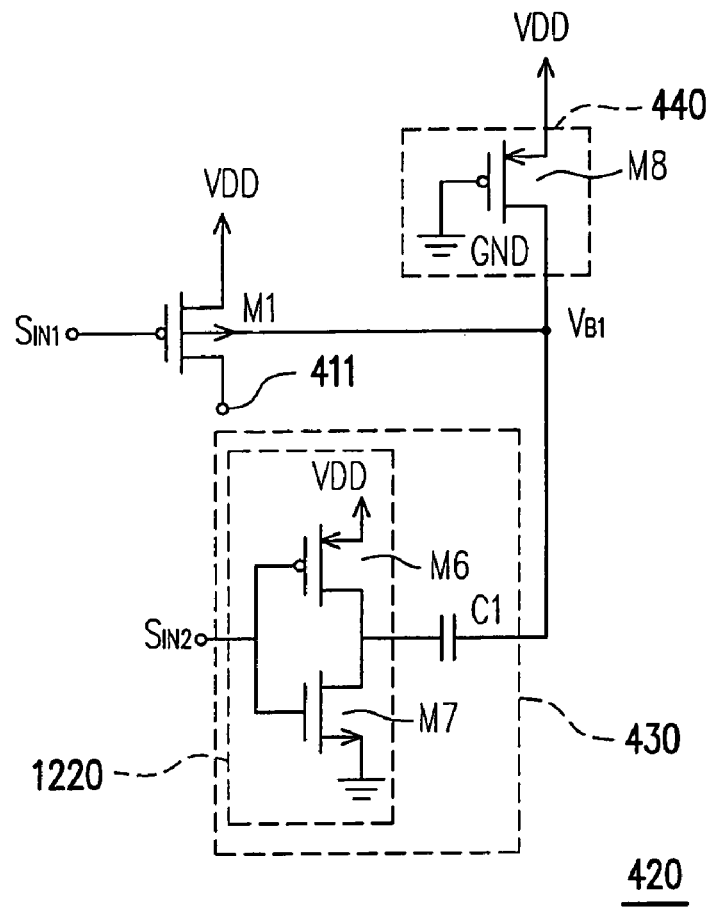
FIG. 12A is a circuit diagram of the power gating circuit of FIG. 4 according to another embodiment.

In addition, the implementation of the power gating circuit 420 is not limited to that of FIG. 5A, and will be illustrated with other embodiments. FIG. 12A is a circuit diagram of the power gating circuit of FIG. 4 according to another embodiment. Referring to FIG. 12A, the charge pump circuit 430 includes an inverter 1220 and a capacitor C1. An input terminal of the inverter 1220 receives the second input signal $S_{IN2}$. A first terminal and a second terminal of the capacitor C1 are coupled to an output terminal of the inverter 1220 and the bulk terminal of the first transistor M1, respectively. In this embodiment, the second input signal $S_{IN2}$ and the first input signal $S_{IN1}$, for example provide the same voltage and phase (i.e., both provide the logic high voltage level or logic low voltage level at the same time).

Figure 12B:
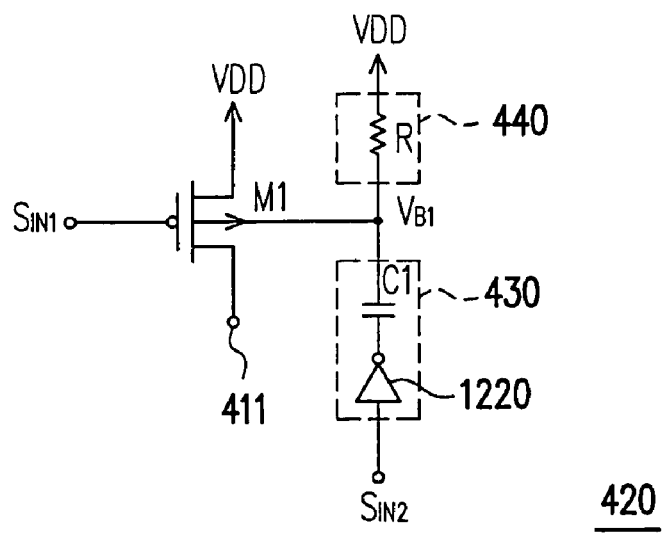
FIG. 12B is a circuit diagram of another embodiment of FIG. 12A.

In addition, the inverter 1220 includes a transistor M6 and a transistor M7. A gate terminal and a first source/drain terminal of the transistor M6 are used as an input terminal and an output terminal of the inverter 1220, respectively. A second source/drain terminal of the transistor M6 is coupled to the second voltage (e.g., the system voltage VDD). A gate terminal and a first source/drain terminal of the transistor M7 are coupled to the gate terminal and the first source/drain terminal of the transistor M6, respectively. A second source/drain terminal of the transistor M7 is coupled to a third voltage (e.g., the ground voltage GND). In this embodiment, the transistor M6, for example, is a PMOS transistor, and the transistor M7, for example, is an NMOS transistor. In this embodiment, the second transistor M8 of the hold circuit 440 is implemented by a PMOS transistor, which may also be replaced by a resistor R, as shown in FIG. 12B.

When the first input signal $S_{IN1}$, and the second input signal $S_{IN2}$ are both at the logic high voltage level (e.g., the system voltage VDD level), and are input to the bulk terminal of the first transistor M1 and the input terminal of the inverter 1220 of the charge pump circuit 430, respectively. As the first input signal $S_{IN1}$ is at the logic high voltage level, the first transistor M1 is not conducted. In other words, the supply of the operating power required by the logic circuit 410 is halted (i.e., the logic circuit 410 enters the sleep state). In another aspect, the second input signal $S_{IN2}$ is converted to the logic low voltage level (e.g., the ground voltage GND level) by the inverter 1220. Therefore, the hold circuit 440 can hold the bulk voltage $V_{B1}$ of the first transistor M1 at around the voltage level of the first voltage (the system voltage VDD). At this time, as the first terminal of the capacitor C1 is at the logic low voltage level, the system voltage VDD will charge the capacitor C1 through the hold circuit 440, such that the voltage difference between two terminals of the capacitor C1 is approximately the system voltage VDD.

If the first input signal $S_{IN1}$, transits to the logic low voltage level (e.g., the ground level GND), the first transistor M1 will be conducted. That is, the power required for the logic circuit 410 to operate will be provided (i.e., the logic circuit 410 enters the normal operating state from the sleep state). In another aspect, the second input signal $S_{IN2}$ also transits to the logic low voltage level, and is converted to the logic high voltage level (e.g., the system voltage VDD) by the inverter 1220. At this time, as the voltage difference between two terminals of the capacitor C1 is about the system voltage VDD, when the output voltage level of the inverter 1220 is VDD, the bulk voltage $V_{B1}$ of the first transistor M1 will be boosted to about 2*VDD. As the bulk voltage $V_{B1}$ of the first transistor M1 is about 2*VDD, and the first source/drain voltage of the first transistor M1 is the first voltage (the system voltage VDD), the first transistor will be affected by the body effect, leading to the change of the threshold voltage of the first transistor M1.

Figure 12C:
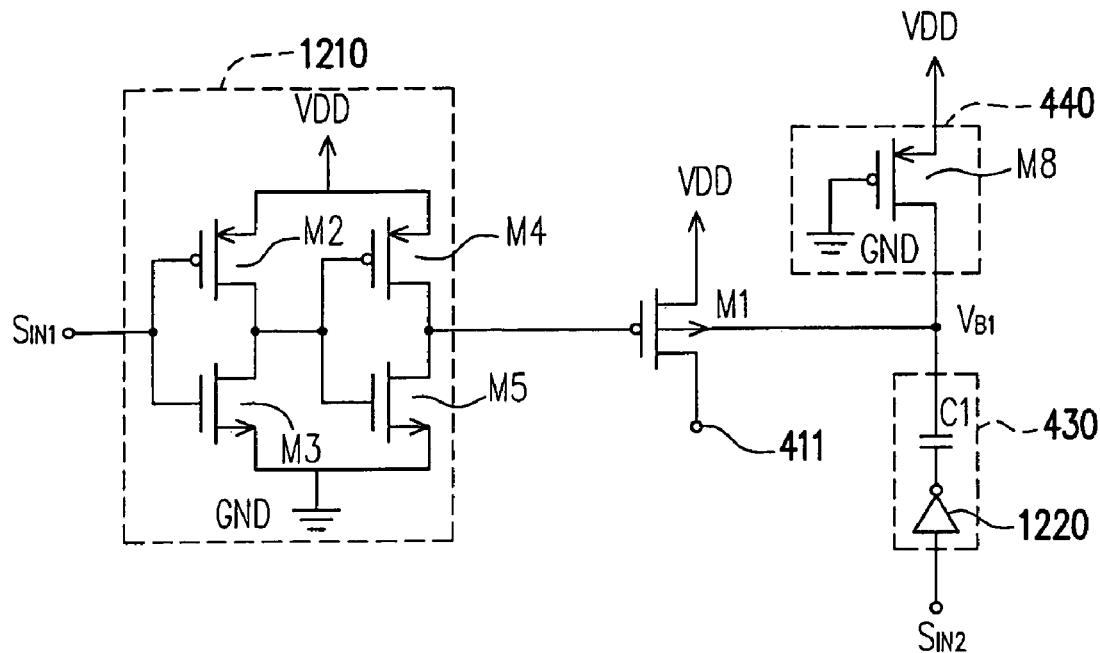
FIG. 12C is a circuit diagram of still another embodiment of FIG. 12A.

FIG. 12C is a circuit diagram of still another embodiment of FIG. 12A. Referring to FIG. 12C, the power gating circuit 420 further includes a buffer circuit 1210. The buffer 1210 is used to gain the first input signal $S_{IN1}$, (or to enhance the driving capability of the first input signal $S_{IN1}$). An output terminal of the buffer circuit 1210 inputs the first input signal $S_{IN1}$, to the gate terminal of the first transistor M1.

The buffer circuit 1210 includes a transistor M2, a transistor M3, a transistor M4, and a transistor M5. A gate terminal of the transistor M2 serves as an input terminal of the buffer circuit 1210, and a first source/drain terminal of the transistor M2 is coupled to the second voltage (e.g., the system voltage VDD). A gate terminal and a first source/drain terminal of the transistor M3 are coupled to the gate terminal and the second source/drain terminal of the transistor M2, respectively. A second source/drain terminal of the transistor M3 is coupled to the third voltage (e.g., the ground voltage GND).

A gate terminal of the transistor M4 is coupled to a second source/drain terminal of the transistor M2, a first source/drain terminal of the transistor M4 is coupled to the second voltage, and a second source/drain terminal of the transistor M4 serves as the output terminal of the buffer circuit 1210. A gate terminal and a first source/drain terminal of the transistor M5 are coupled to the gate terminal and the second source/drain terminal of the transistor M4 respectively, and a second source/drain terminal of the transistor M5 is coupled to the third voltage. In this embodiment, the transistor M2 and the transistor M4, for example, are PMOS transistors, and the transistor M3 and the transistor M5, for example, are NMOS transistors.

Figure 12D:
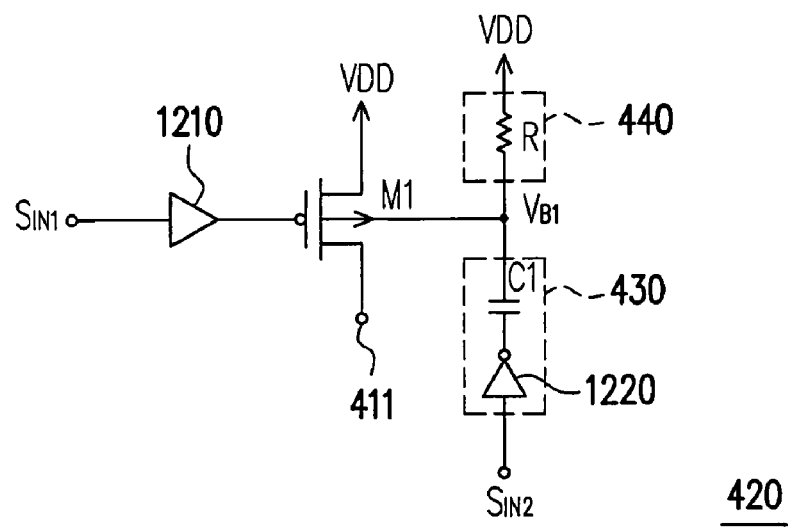
FIG. 12D is a circuit diagram of another embodiment of FIG. 12C.

The internal circuit and operation of the charge pump circuit 430 is the same as those of FIG. 12A, and will not be described herein again. In this embodiment, the second input signal $S_{IN2}$ and the first input signal $S_{IN1}$, for example, provide the same voltage level and phase. The second transistor M8 of the hold circuit 440 is implemented by a PMOS transistor, which may also be replaced by a resistor R, as shown in FIG. 12D. Though the power gating circuit 420 of FIG. 12C additionally has a buffer circuit 1210, the effect of this embodiment is also realized. The circuit operation of FIGS. 12C and 12B may refer to that of FIG. 12A, and will not be described herein again.

Figure 13A:
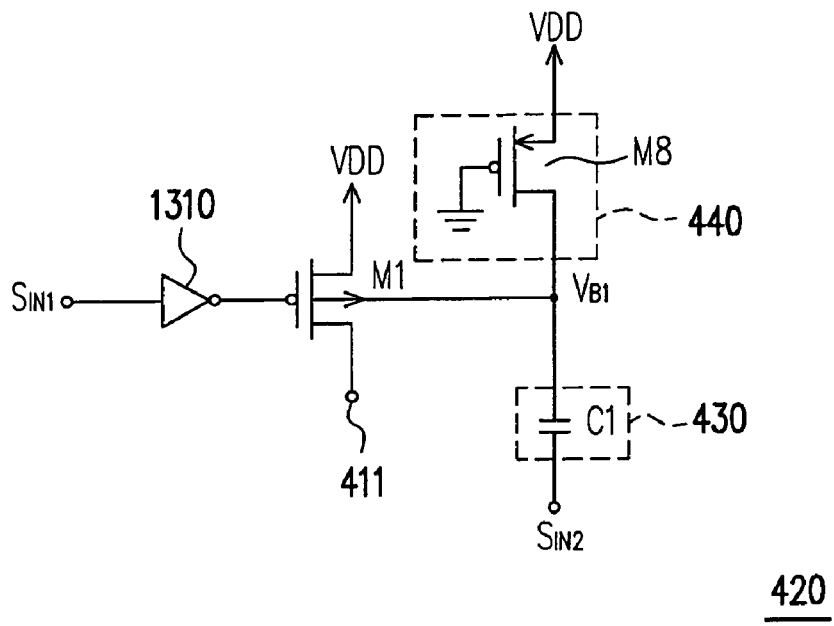
FIG. 13A is a circuit diagram of the power gating circuit of FIG. 4 according to still another embodiment.
Figure 13B:
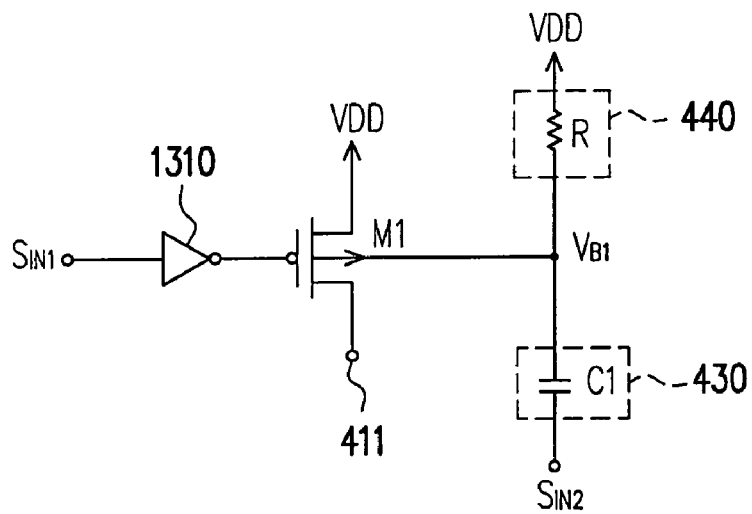
FIG. 13B is a circuit diagram of another embodiment of FIG. 13A.

FIG. 13A is a circuit diagram of the power gating circuit of FIG. 4 according to still another embodiment. The differences between FIGS. 13A and 12A are described as follows. In FIG. 12A, the gate terminal of the first transistor M1 is coupled to the first input signal $S_{IN1}$, and the charge pump circuit 430 includes the inverter 1220. In FIG. 13A, the inverter 1310 is coupled between the gate terminal of the first transistor M1 and the first input signal $S_{IN1}$, and the first terminal of the capacitor C1 of the charge pump circuit 430 is coupled to the second input signal $S_{IN2}$. Here, the second input signal $S_{IN2}$ and the first input signal $S_{IN1}$, for example, provide the same voltage level and phase. Though the power gating circuit 420 of FIG. 13A uses different circuit elements, the effect of this embodiment may also be realized. In this embodiment, the second transistor M8 of the hold circuit 440 is implemented by a PMOS transistor, which may also be replaced by a resistor R, as shown in FIG. 13B. In addition, the circuit operation of FIGS. 13A and 13B may refer to that of FIGS. 12A and 12B, and will not be described herein again.

Figure 13C:
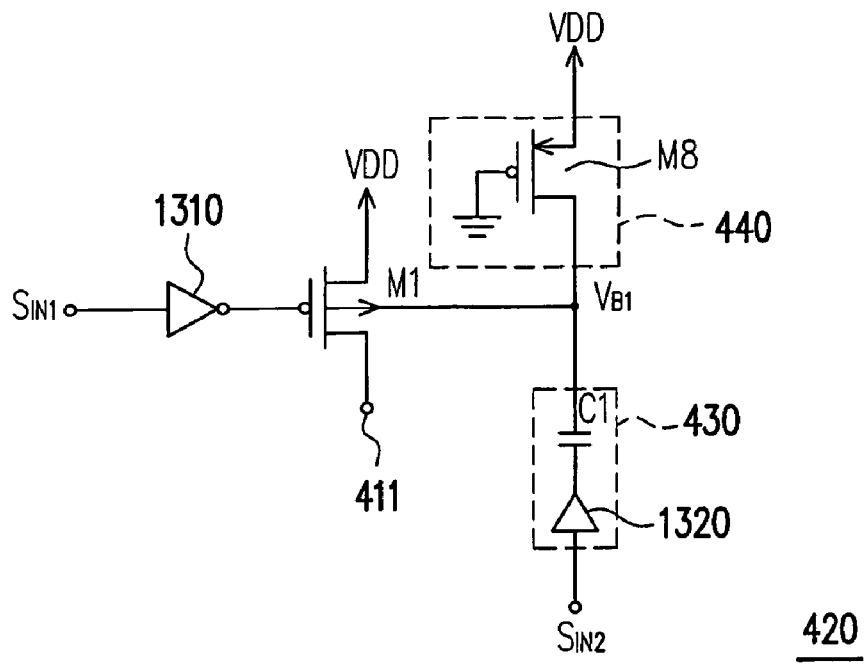
FIG. 13C is a circuit diagram of still another embodiment of FIG. 13A.
Figure 13D:
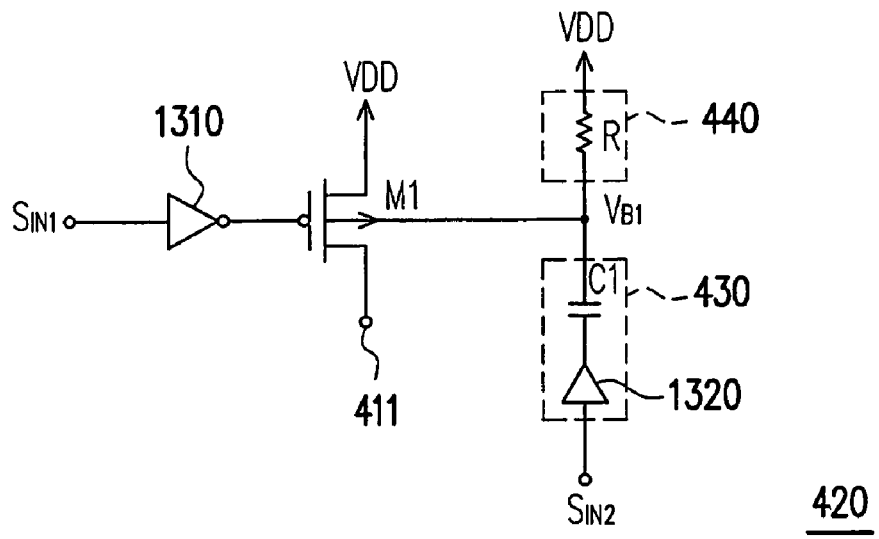
FIG. 13D is a circuit diagram of another embodiment of FIG. 13C.

FIG. 13C is a circuit diagram of still another embodiment of FIG. 13A. The differences between FIGS. 13C and 12C are described as follows. In FIG. 12C, the buffer circuit 1210 is coupled between the gate terminal of the first transistor M1 and the first input signal $S_{IN1}$, and the charge pump circuit 430 uses the inverter 1220. In FIG. 13C, the inverter 1310 is coupled between the gate terminal of the first transistor M1 and the first input signal $S_{IN1}$, and the charge pump circuit 430 uses the buffer 1320. Here, the second input signal $S_{IN2}$ and the first input signal $S_{IN1}$, for example, provide the same voltage level and phase. Though the power gating circuit 420 of FIG. 13C uses different circuit elements, the effect of this embodiment may also be realized. In this embodiment, the second transistor M8 of the hold circuit 440 is implemented by a PMOS transistor, which may also be replaced by a resistor R, as shown in FIG. 13D. Moreover, the circuit operation of FIGS. 13C and 13D may refer to that of FIG. 12A, and will not be described herein again.

In addition, in the above embodiments, the power gating circuit 420, for example, is arranged between the system voltage VDD and the power terminal 411 of the logic circuit 410. However, the present invention is not limited to this. For example, the power gating circuit may also be disposed between the ground voltage GND and the power terminal of the logic circuit.

Figure 14:
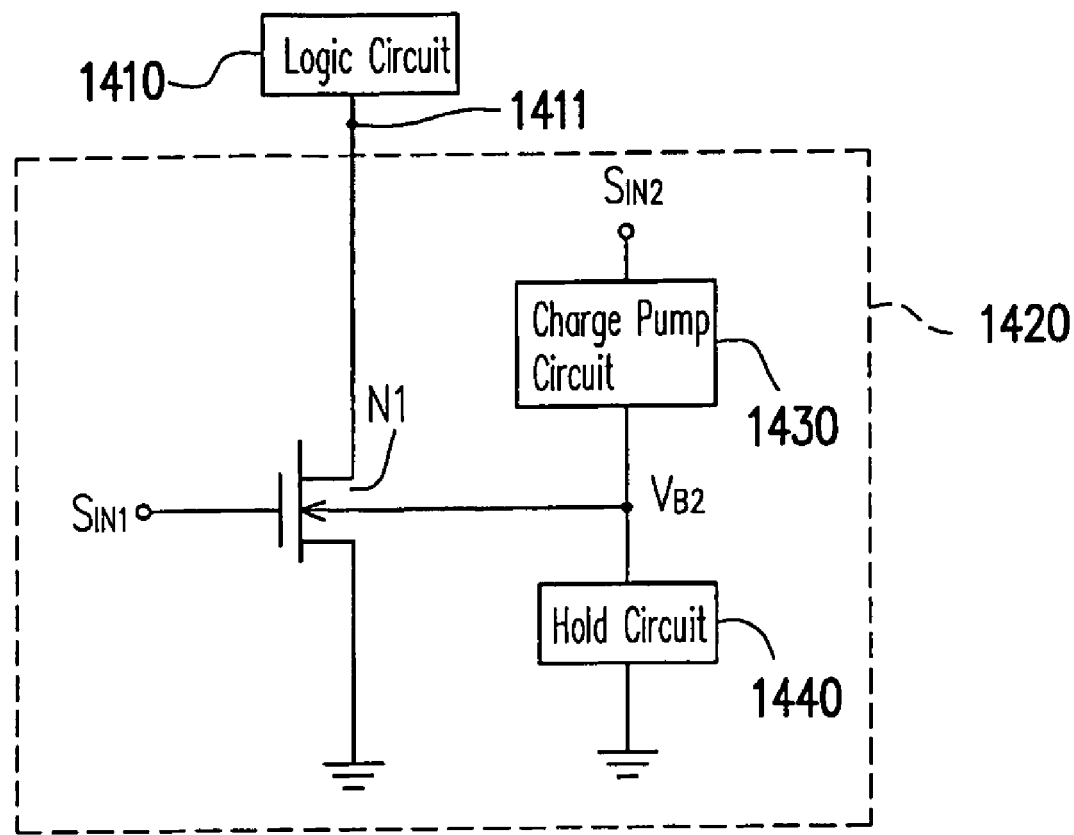
FIG. 14 is a block diagram of an SOC according to an embodiment of the present invention.

FIG. 14 is a block diagram of an SOC according to an embodiment of the present invention. Referring to FIG. 14, the SOC 1400 includes a logic circuit 1410 and a power gating circuit 1420. Through the control of the first input signal $S_{IN1}$, a first voltage (e.g., the ground voltage GND) is determined whether or not to pass through the power gating circuit 1420 to serve as an output voltage, so as to provide the operating power required by the logic circuit 1410. Therefore, the SOC 1400 may selectively turn off the logic circuit 1410, so as to reduce the power consumption of the SOC 1400.

The logic circuit 1410 has a power terminal 1411 for receiving power required for the logic circuit 1410 to operate. The power gating circuit 1420 includes a transistor N1, a charge pump circuit 1430, and a hold circuit 1440. In this embodiment, the transistor N1, for example, is an NMOS transistor. A first source/drain terminal of the transistor N1 is coupled to the first voltage (e.g., the ground voltage GND). The first transistor N1 whose gate terminal is controlled by the state of the first input signal $S_{In1}$, (e.g., a logic high voltage level or a logic low voltage level) provides an output voltage to the power terminal 1411 of the logic circuit 1410 at a second source/drain terminal of the first transistor N1, so as to provide the power required for the logic circuit 1410 to operate.

The charge pump circuit 1430 is coupled to a bulk terminal of the transistor N1, and changes a bulk voltage $V_{B2}$ of the transistor N1 (e.g., reduce the bulk voltage $V_{B2}$ of the transistor N1) according to the state of a second input signal $S_{IN2}$. The hold circuit 1440 is coupled to the bulk terminal of the transistor N1 for holding the bulk voltage $V_{B2}$ of the transistor N1. A threshold voltage of the transistor N1 may be adjusted through the architecture of the power gating circuit 1420, so as to reduce the transient current when the transistor N1 is conducted, and further to suppress the voltage fluctuation of the SOC 1400.

Figure 15A:
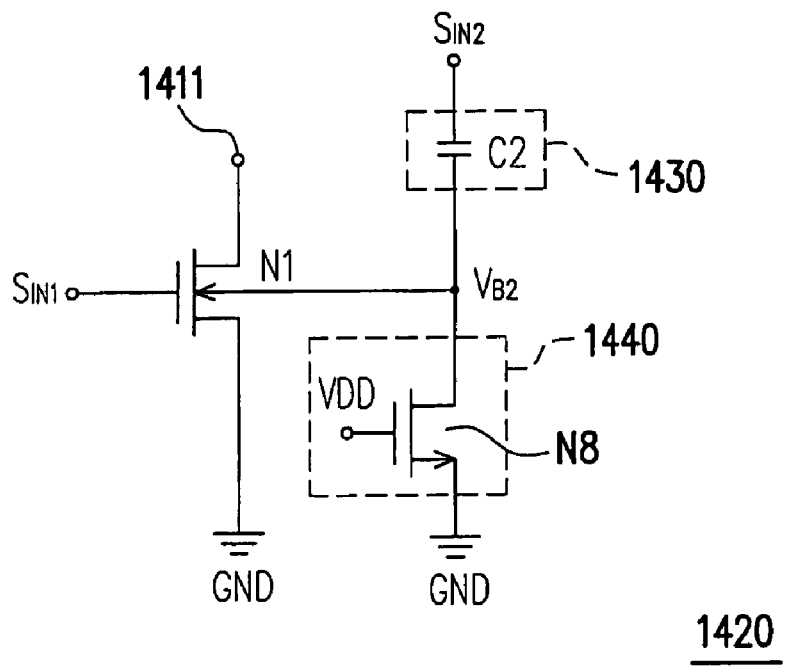
FIG. 15A is a circuit diagram of the power gating circuit of FIG. 14.

FIG. 15A is a circuit diagram of the power gating circuit 1420 of FIG. 14. Referring to FIG. 15A, the charge pump circuit 1430 includes a capacitor C2. A first terminal and a second terminal of the capacitor C2 are coupled to the second input signal $S_{IN2}$ and the bulk terminal of the transistor N1. In this embodiment, the second input signal $S_{IN2}$ and the first input signal $S_{IN1}$, for example, provide different voltage levels and phases.

Figure 15B:
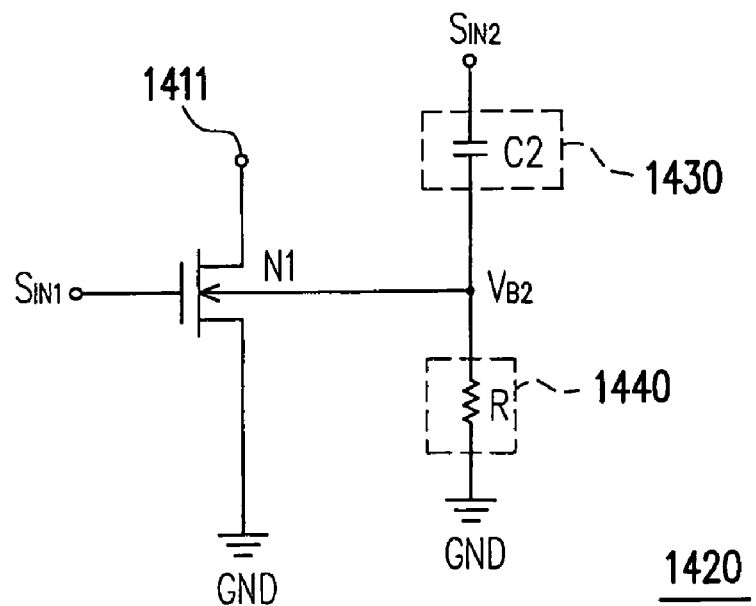
FIG. 15B is a circuit diagram of another embodiment of FIG. 15A.

The hold circuit 1440 includes a transistor N8. A gate terminal of the transistor N8 is coupled to a fourth voltage (e.g., the system voltage VDD), and a first source/drain terminal of the transistor N8 is coupled to the first voltage (e.g., the ground voltage GND). Thus, the transistor N8 is constantly in the conducted state, such that the bulk voltage $V_{B2}$ of the transistor N1 remains at the voltage level of the ground voltage GND. In this embodiment, the transistor N8, for example, is an NMOS transistor. Moreover, in another embodiment of the present invention, the hold circuit 1440 may be implemented by an impedor, as shown in FIG. 15B. A first terminal of the impedor is coupled to the first voltage (e.g., the ground voltage GND), and a second terminal of the impedor is coupled to the bulk terminal of the transistor N1. In this embodiment, the impedor, for example, is a resistor R.

Hereinafter, the operating process of the power gating circuit 1420 will be described. Firstly, provided that the first input signal $S_{IN1}$ is the logic low voltage level (e.g., the ground voltage GND), and the second input signal $S_{IN2}$ has a reverse phase to that of the first input signal $S_{IN1}$, i.e., the second input signal $S_{IN2}$ is the logic high voltage level (e.g., the system voltage VDD). As the first input signal $S_{IN1}$ is at the logic low voltage level, the transistor N1 is not conducted. In other words, the supply of the operating power required by the logic circuit 1410 is halted (i.e., the logic circuit 1410 enters the sleep state). In another aspect, as the voltage level of the second input signal $S_{IN2}$ is the system voltage VDD, and the second terminal of the capacitor C2 is coupled to the ground voltage GND through the hold circuit 1440, the second input signal $S_{IN2}$ will charge the capacitor C2, such that the voltage difference between two terminals of the capacitor C2 is about the system voltage VDD.

On the contrary, if the first input signal $S_{IN1}$ transits to the logic high voltage level (e.g., the system voltage VDD), the transistor N1 will be conducted. That is, the power required for the logic circuit 1410 to operate will be provided (i.e., the logic circuit 1410 enters the normal operating state from the sleep state). In another aspect, the second input signal $S_{IN2}$ will transit to the logic low voltage level (e.g., the ground voltage GND). At this time, the voltage difference between two terminals of the capacitor C2 is about the system voltage VDD, and the second input signal $S_{IN2}$ is the ground voltage GND. Therefore, the bulk voltage $V_{B2}$ of the transistor N1 will be bucked to about −VDD. As the bulk voltage $V_{B2}$ of the transistor N1 is about −VDD, and the first source/drain voltage of the transistor N1 is the first voltage (the ground voltage GND), the transistor N1 will be affected by the body effect, such that the threshold voltage of the transistor N1 changes.

When the transistor N1 is just conducted, the bulk voltage $V_{B2}$ of the transistor N1 (about −VDD) is smaller than the first source/drain voltage (GND). Therefore, the bulk-source voltage $V_{SB}$ of the transistor N1 is −VDD, and the threshold voltage $V_{TH}$ of the transistor N1 rises, such that the output current when the transistor N1 is conducted is small. Then, the hold circuit 1440 discharges the bulk voltage $V_{B2}$ of the transistor N1 at a predetermined rate, such that the bulk voltage $V_{B2}$ gradually approaches the voltage level of the ground voltage GND. When the bulk voltage $V_{B2}$ of the transistor N1 gradually decreases, the current when the transistor N1 is conducted becomes larger gradually. Thus, this embodiment can effectively reduce the transient current generated by the power gating circuit 1420, so as to suppress the voltage fluctuation of the logic circuit 1410, such that the SOC 1400 will not generate error actions.

Figure 16A:
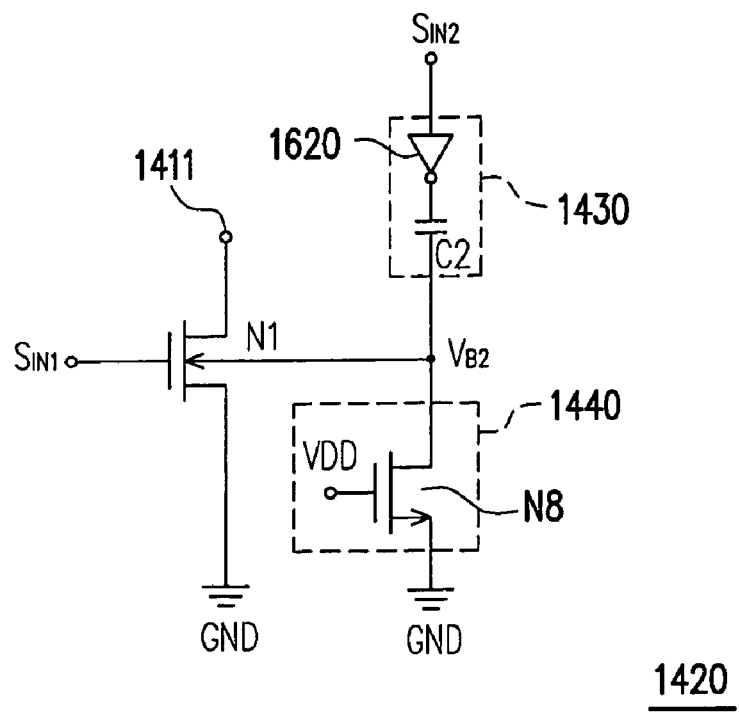
FIG. 16A is a circuit diagram of the power gating circuit of FIG. 14 according to another embodiment.
Figure 16B:
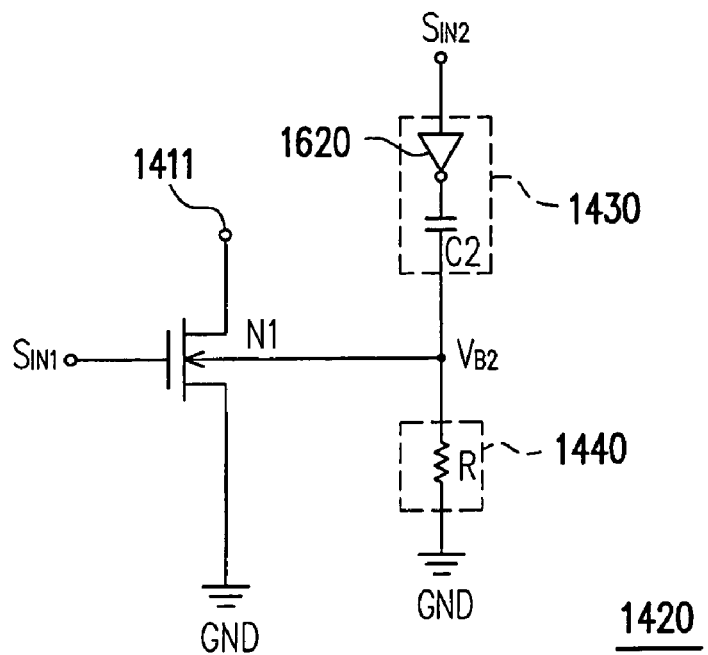
FIG. 16B is a circuit diagram of another embodiment of FIG. 16A.

In addition, the implementation of the power gating circuit 1420 of this embodiment may be different from that of FIG. 15A, and will be illustrated with other embodiments. FIG. 16A is a circuit diagram of the power gating circuit of FIG. 14 according to another embodiment. Referring to FIG. 16A, the charge pump circuit 1430 includes an inverter 1620 and a capacitor C2. An input terminal of the inverter 1620 receives the second input signal $S_{IN2}$. A first terminal and a second terminal of the capacitor C2 are coupled to an output terminal of the inverter 1620 and the bulk terminal of the transistor N1. In this embodiment, the second input signal $S_{IN2}$ and the first input signal $S_{IN1}$, for example, provide the same voltage level and phase. The second transistor M8 of the hold circuit 1440 is implemented by an NMOS transistor, which may also be replaced by a resistor R, as shown in FIG. 16B.

If the first input signal $S_{IN1}$, transits to the logic low voltage level (e.g., the ground level GND), the transistor N1 will not be conducted. In other words, the supply of the operating power required by the logic circuit 1410 is halted (i.e., the logic circuit 1410 enters the sleep state). In another aspect, as the second input signal $S_{IN2}$ is the logic low voltage level (e.g., the ground voltage GND), and is converted to the logic high voltage level (e.g., the system voltage VDD) by the inverter 1620, the inverter 1620 will charge the capacitor C2, such that the voltage difference between two terminals of the capacitor C2 is about the system voltage VDD.

On the contrary, if the first input signal $S_{IN1}$ transits to the logic high voltage level (e.g., the system voltage VDD), the transistor N1 will be conducted. That is, the power required for the logic circuit 1410 to operate will be provided (i.e., the logic circuit 1410 enters the normal operating state from the sleep state). In another aspect, the second input signal $S_{IN2}$ transits to the logic high voltage level, and is converted to the logic low voltage level (e.g., the ground voltage GND) by the inverter 1620. At this time, as the voltage difference between two terminals of the capacitor C2 is about the system voltage VDD, when the inverter 1620 outputs the ground voltage GND, the bulk voltage $V_{B2}$ of the transistor N1 will be bucked to about −VDD. As the bulk voltage $V_{B2}$ of the transistor N1 is about −VDD, and the first source/drain voltage of the transistor N1 is the first voltage (the ground voltage GND), the transistor N1 will be affected by the body effect, such that the threshold voltage of the transistor N1 changes.

Figure 16C:
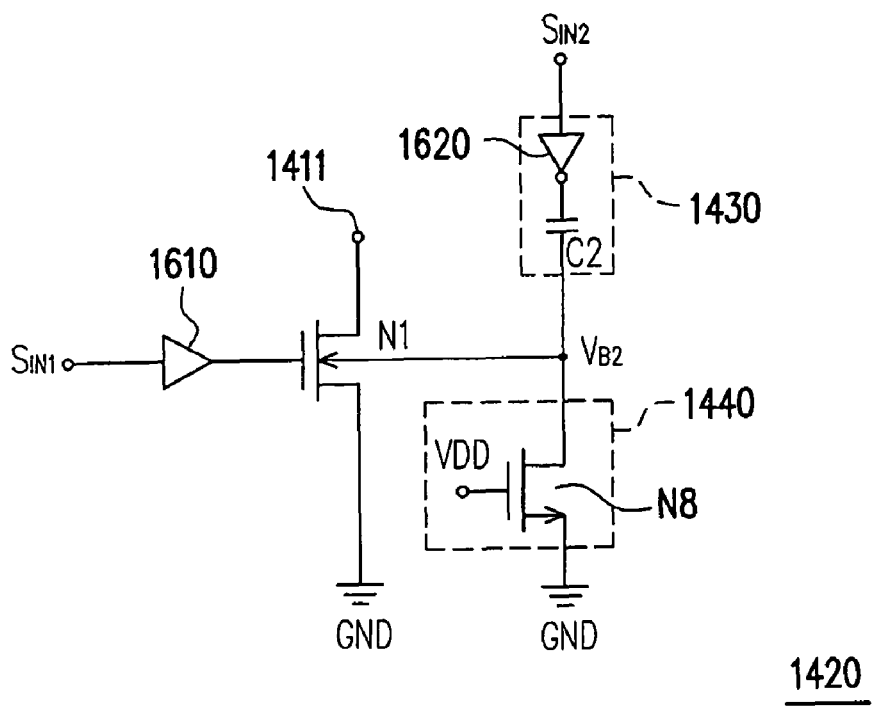
FIG. 16C is a circuit diagram of still another embodiment of FIG. 16A.
Figure 16D:
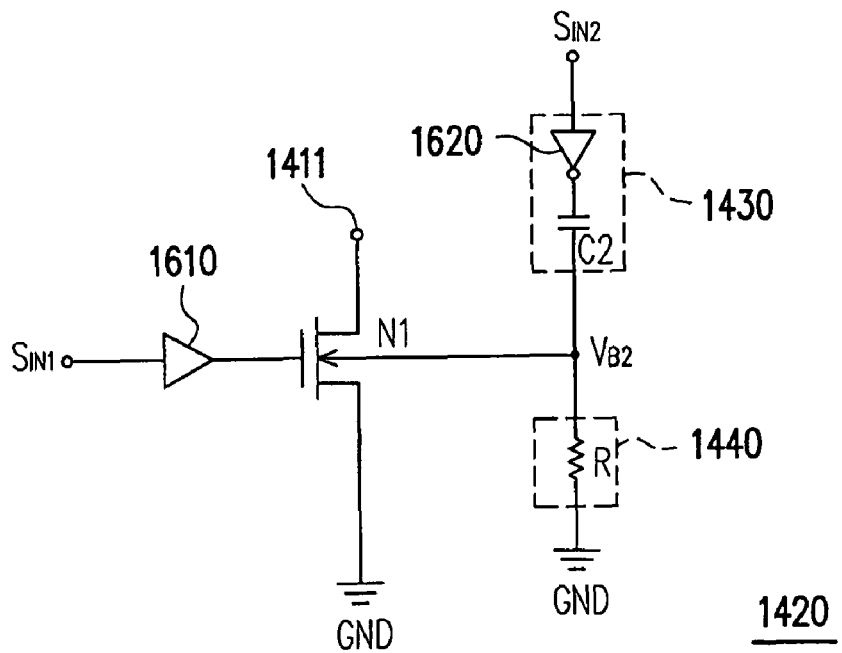
FIG. 16D is a circuit diagram of another embodiment of FIG. 16C.

FIG. 16C is a circuit diagram of still another embodiment of FIG. 16A. Referring to FIG. 16C, the power gating circuit 1420 further includes a buffer circuit 1610. The buffer circuit 1610 is used to gain the first input signal $S_{IN1}$ (or to enhance the driving capability of the first input signal $S_{IN1}$), and an output terminal of the buffer circuit 1610 inputs the first input signal $S_{IN1}$ to the gate terminal of the transistor N1. The internal circuit and operation of the buffer circuit 1610 is similar to the description of the buffer circuit 1210 of FIG. 12C, and will not be described herein again. The internal circuit and operation of the charge pump circuit 1430 is similar to that of FIG. 16A, and will not be described herein again. In this embodiment, the second input signal $S_{IN2}$ and the first input signal $S_{IN1}$, for example, provide the same voltage level and phase. The transistor N8 of the hold circuit 1540 is implemented by an NMOS transistor, which may also be replaced by a resistor R, as shown in FIG. 16D. The circuit operation of FIGS. 16C and 16D is as shown in FIGS. 16A and 16B, and will not be described herein again.

Figure 17A:
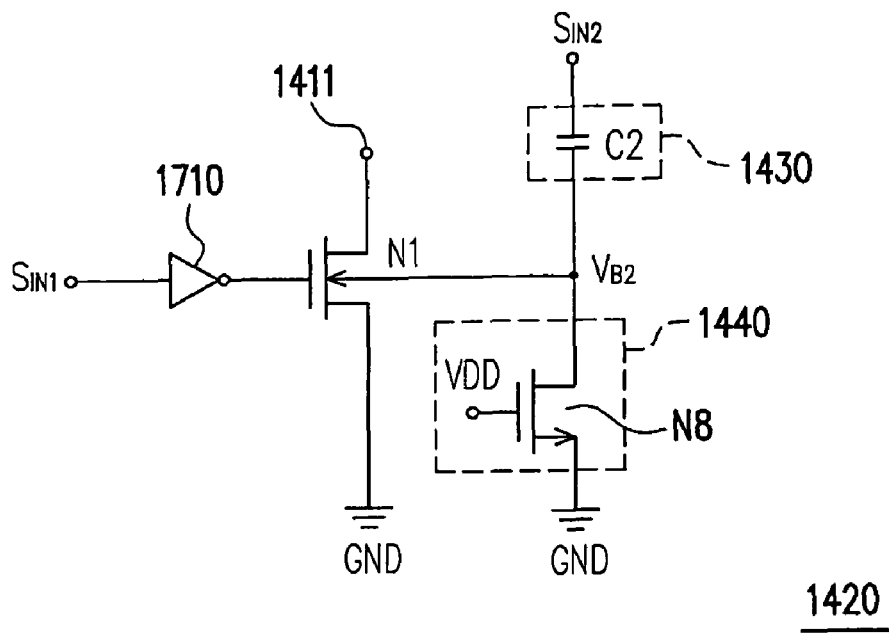
FIG. 17A is a circuit diagram of the power gating circuit of FIG. 14 according to still another embodiment.
Figure 17B:
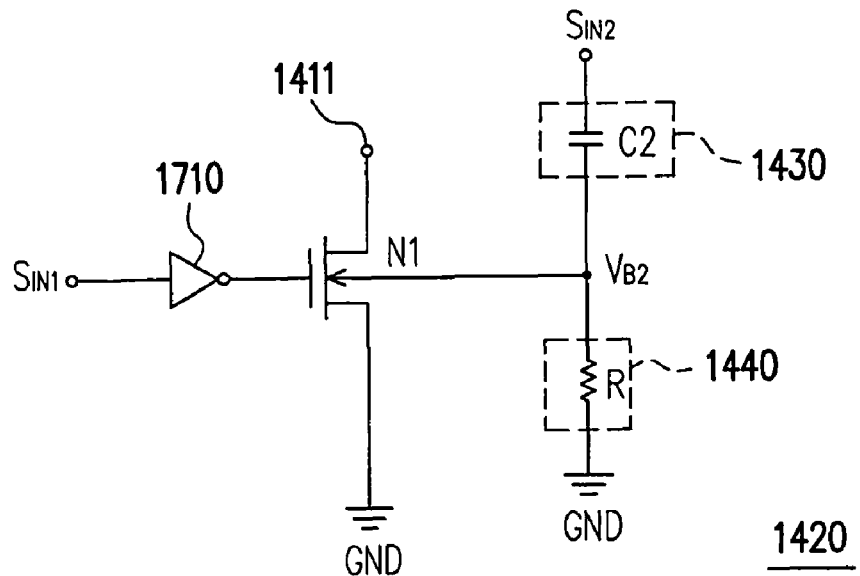
FIG. 17B is a circuit diagram of another embodiment of FIG. 17A.

FIG. 17A is a circuit diagram of the power gating circuit of FIG. 14 according to still another embodiment. The differences between FIGS. 17A and 16A are described as follows. In FIG. 16A, the gate terminal of the transistor N1 is coupled to the first input signal $S_{IN1}$, and the charge pump circuit 1430 uses the inverter 1620. In FIG. 17A, the inverter 1710 is coupled between the gate terminal of the transistor N1 and the first input signal $S_{IN1}$, and the first terminal of the capacitor C2 of the charge pump circuit 1430 is coupled to the second input signal $S_{IN2}$. Here, the second input signal $S_{IN2}$ and the first input signal $S_{IN1}$, for example, provide the same voltage level and phase. Though the power gating circuit 1420 of FIG. 17A uses different circuit elements, the effect of this embodiment is also realized. Persons of ordinary skill in the art can deduce the operating process of the embodiment of FIG. 17A according to the implementation mode of FIG. 16A, so the operating process of the embodiment of FIG. 17A will not described herein. In this embodiment, the transistor N8 of the hold circuit 1440 is implemented by an NMOS transistor, which may also be replaced by a resistor R, as shown in FIG. 17B.

Figure 17C:
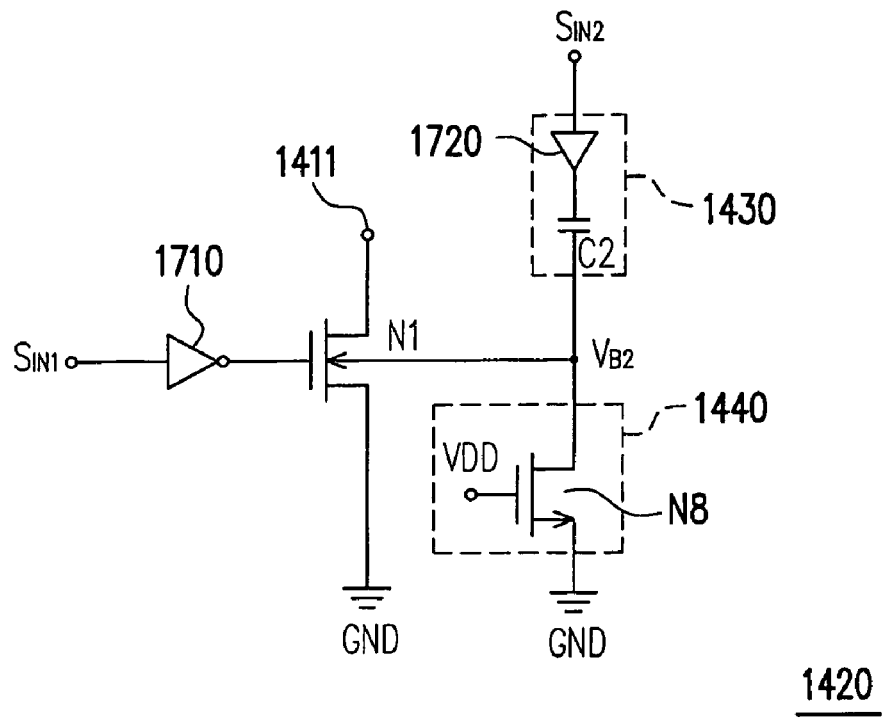
FIG. 17C is a circuit diagram of still another embodiment of FIG. 17A.
Figure 17D:
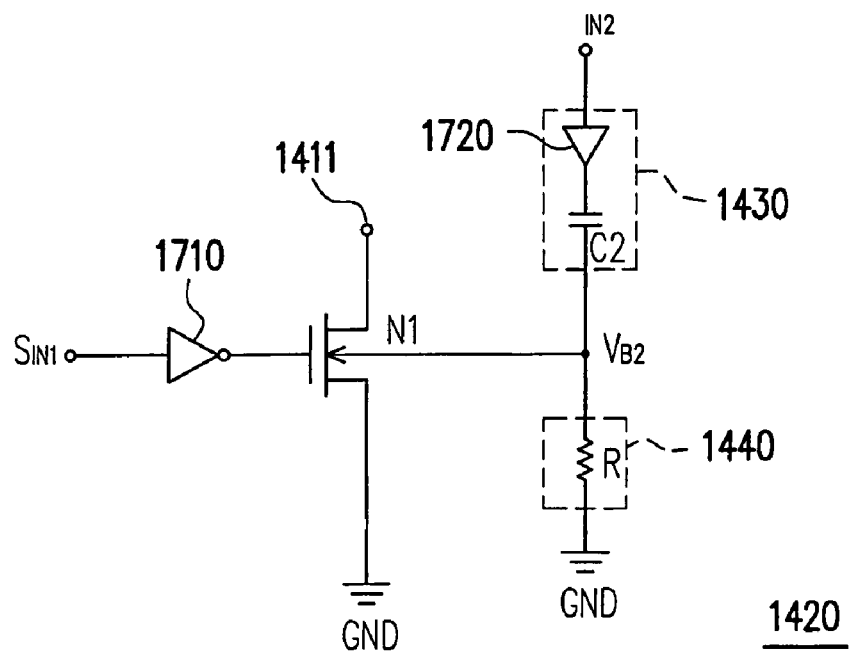
FIG. 17D is a circuit diagram of another embodiment of FIG. 17C.

FIG. 17C is a circuit diagram of still another embodiment of FIG. 17A. The differences between FIGS. 17C and 16C are described as follows. In FIG. 16C, the buffer circuit 1610 is coupled between the gate terminal of the transistor N1 and the first input signal $S_{IN1}$, and the charge pump circuit 1430 uses the inverter 1620. In FIG. 17C, the inverter 1710 is coupled between the gate terminal of the transistor N1 and the first input signal $S_{IN1}$, and the charge pump circuit 1430 uses the buffer 1720. Here, the second input signal $S_{IN2}$ and the first input signal $S_{IN1}$, for example, provide the same voltage level and phase. Though the power gating circuit 1420 of FIG. 17C uses different circuit elements, the effect of this embodiment is also realized. In this embodiment, the transistor N8 of the hold circuit 1440 is implemented by an NMOS transistor, which may also be replaced by a resistor R, as shown in FIG. 17D. Moreover, the circuit operation of FIGS. 17C and 17D may refer to that of FIGS. 16C and 16D, and will not be described herein again.

In this embodiment, the SOCs 400 and 1500 both use a power gating circuit to provide the power required for the logic circuits 410 and 1510 to operate. However, the present invention is not limited to this, and the SOC may also use two or more power gating circuits to provide the power required for driving the operation of the logic circuit, which will be described with other embodiments.

Figure 18A:
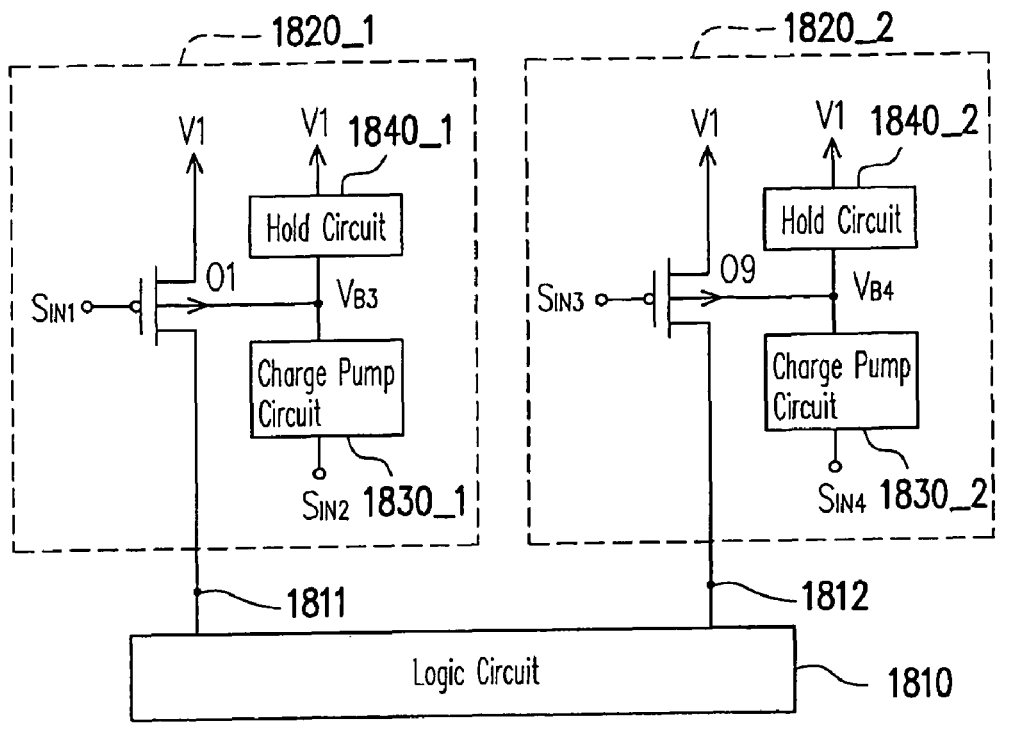
FIG. 18A is a block diagram of an SOC according to an embodiment of the present invention.

FIG. 18A is a block diagram of an SOC according to an embodiment of the present invention. Referring to FIG. 18A, the SOC 1800 includes a logic circuit 1810 and power gating circuits 1820_1 and 1820_2. The logic circuit 1810 has power terminals 1811 and 1812 for receiving power required for the logic circuit 1810 to operate. The power gating circuit 1820_1 includes a transistor O1, a charge pump circuit 1830_1, and a hold circuit 1840_1. A gate terminal of the transistor O1 is controlled by the first input signal $S_{IN1}$. A first source/drain terminal of the transistor O1 is coupled to a first voltage V1. A second source/drain terminal of the transistor O1 is coupled to the power terminal 1811 of the logic circuit 1810. The charge pump circuit 1830_1 is coupled to a bulk terminal of the transistor O1 for changing a bulk voltage $V_{B3}$ of the transistor O1 according to the second input signal $S_{IN2}$. The hold circuit 1840_1 is coupled to the bulk terminal of the transistor O1 for holding the bulk voltage $V_{B3}$ of the transistor O1.

The power gating circuit 1820_2 includes a transistor O9, a charge pump circuit 1830_2, and a hold circuit 1840_2. A gate terminal of the transistor O9 is controlled by a third input signal $S_{IN3}$. A first source/drain terminal of the transistor O9 is coupled to the first voltage V1. A second source/drain terminal of the transistor O9 is coupled to the power terminal 1812 of the logic circuit 1812. The charge pump circuit 1830_2 is coupled to a bulk terminal of the transistor O9 for changing a bulk voltage $V_{B4}$ of the transistor O9 according to a fourth input signal $S_{IN4}$. The hold circuit 1840_2 is coupled to the bulk terminal of the transistor O9 for holding the bulk voltage $V_{B4}$ of the transistor O9.

In this embodiment, the transistors O1 and O9 are implemented by PMOS transistors, and the first voltage V1 may be the system voltage VDD. The internal circuit structure and circuit operation of the power gating circuits 1820_1 and 1820_2 are similar to the embodiments of FIGS. 5A, 5B, 12A to 12D, and 13A to 13D, and will not be described herein again. When the implementation mode refers to that of FIG. 5A, 12A, 13A, or 13C, the fourth voltage may be the ground voltage GND.

Figure 18B:
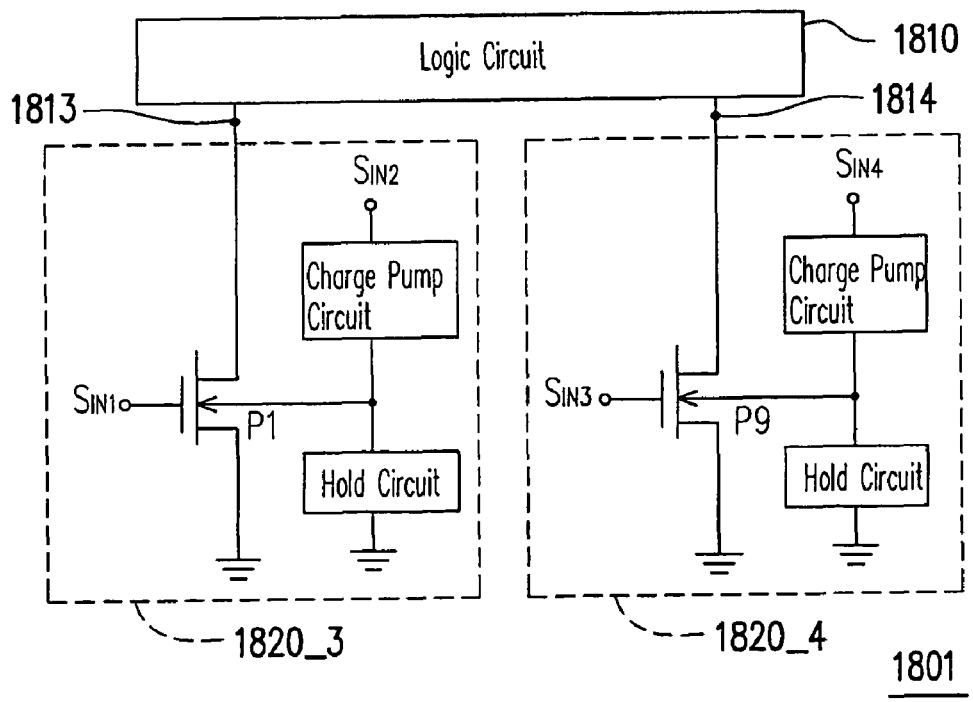
FIG. 18B shows an example to implement another SOC according to the description of the present invention.

FIG. 18B shows an example to implement another SOC according to the description of the present invention. In the SOC 1801 of FIG. 18B, a transistor P1 of a power gating circuit 1820_3 and a transistor P9 of a power gating circuit 1820_4 are disposed between the power terminals 1813 and 1814 of the logic circuit 1810 and the ground voltage GND. In this embodiment, the transistor P1 and P9 are implemented by NMOS transistors. The internal circuit structure and circuit operation of the power gating circuits 1820_3 and 1820_4 may refer to the embodiments of FIGS. 15A, 15B, 16A to 16D, and 17A to 17D, and will not be described herein again. When the implementation mode refers to that of FIG. 15A, 16A, 16C, 17A, or 17C, the fourth voltage may be the system voltage VDD.

Referring to FIG. 18A, the transistors O1 and O9 of the above embodiment are respectively controlled by the first input signal $S_{IN1}$ and the third input signal $S_{IN3}$, and provide the power required for the logic circuit 1810 to operate through the power terminals 1811 and 1812 of the logic circuit 1810. In this embodiment, the power gating circuits 1820_1 and 1820_2 may be conducted at the same time, i.e., the first input signal $S_{IN1}$ and the third input signal $S_{IN3}$ provide the same voltage level and phase (i.e., the logic high voltage level or the logic low voltage level at the same time), such that the power gating circuits 1820_1 and 1820_2 provide the power required for the logic circuit 1810 to operate at the same time. Or, the power gating circuits 1820_1 and 1820_2 are actuated at different time, i.e., the first input signal $S_{IN1}$, and the third input signal $S_{IN3}$ have different phases. Therefore, the power gating circuit 1820_1 may provide the power required for the logic circuit 1810 to operate first, and the power gating circuits 1820_1 and 1820_2 then provide power to the logic circuit 1810 together after a predetermined time. However, the present invention is not limited to this. Then, another example will be given below for illustration.

Figure 19:
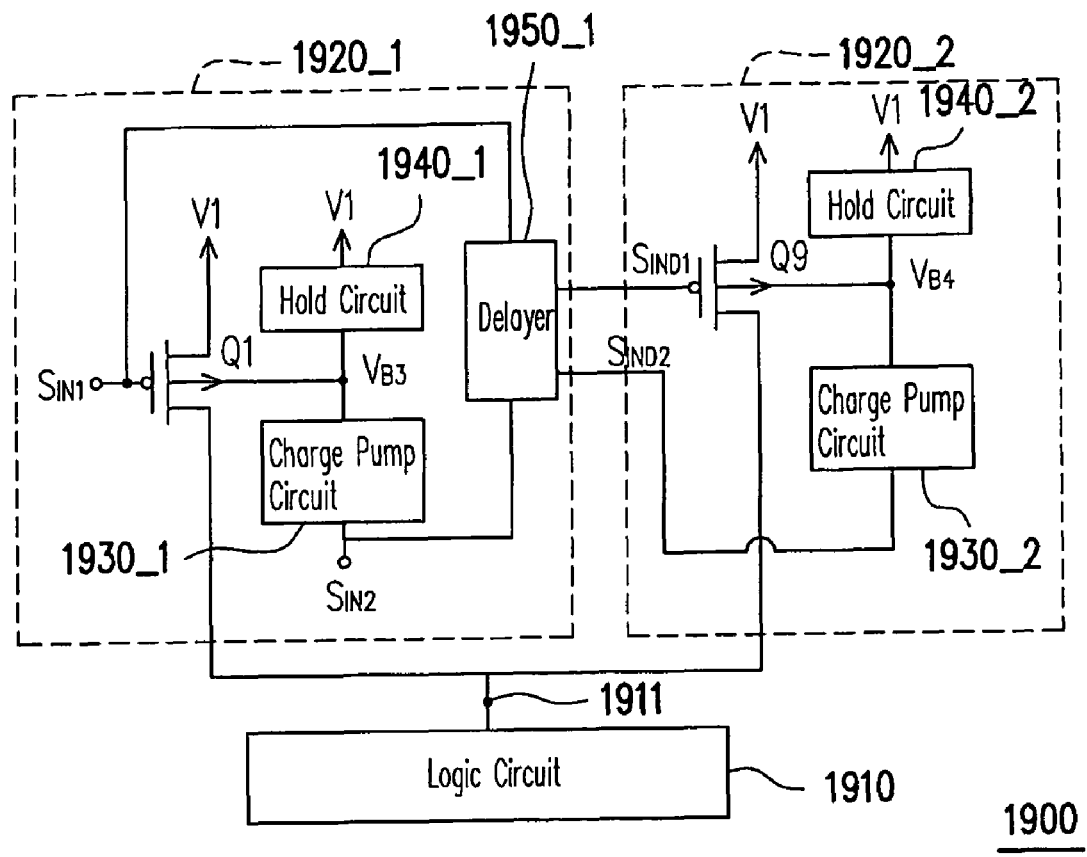
FIG. 19 is a block diagram of an SOC according to an embodiment of the present invention.

FIG. 19 is a block diagram of an SOC according to an embodiment of the present invention. Referring to FIG. 19, the SOC 1900 includes a logic circuit 1910 and power gating circuits 1920_1 and 1920_2. The logic circuit 1910 has a power terminal 1911 for receiving power required for the logic circuit 1910 to operate. The power gating circuit 1920_1 includes a transistor Q1, a charge pump circuit 1930_1, a hold circuit 1940_1, and a delay element 1950_1. A gate terminal of the transistor Q1 is controlled by the first input signal $S_{IN1}$. A first source/drain terminal of the transistor Q1 is coupled to a first voltage V1. A second source/drain terminal of the transistor Q1 is coupled to the power terminal 1911 of the logic circuit 1910. The charge pump circuit 1930_1 is coupled to a bulk terminal of the transistor Q1 for changing a bulk voltage $V_{B3}$ of the transistor Q1 according to the second input signal $S_{IN2}$. The hold circuit 1940_1 is coupled to the bulk terminal of the transistor Q1 for holding the bulk voltage $V_{B3}$ of the transistor Q1. The delay element 1950_1 is used to delay the first input signal $S_{IN1}$, and the second input signal $S_{IN2}$ for a period of time and then output them.

The power gating circuit 1920_2 includes a transistor Q9, a charge pump circuit 1930_2, and a hold circuit 1940_2. A gate terminal of the transistor Q9 is controlled by an output $S_{IND1}$ of a first output terminal of the delay element 1950_1. The first source/drain terminal of the transistor Q9 is coupled to the first voltage V1, and the second source/drain terminal of the transistor Q9 is coupled to the power terminal 1911 of the logic circuit 1910. The charge pump circuit 1930_2 is coupled to a bulk terminal of the transistor Q9 for changing a bulk voltage $V_{B4}$ of the transistor Q9 according to an output $S_{IND2}$ of a second output terminal of the delay element 1950_1. The hold circuit 1940_2 is coupled to the bulk terminal of the transistor Q9 for holding the bulk voltage $V_{B4}$ of the transistor Q9.

In this embodiment, the SOC 1900 uses the delay element 1950_1 to actuate the power gating circuits 1920_1 and 1920_2 sequentially. That is, the first input signal $S_{IN1}$ will actuate the power gating circuit 1920_1 first. The first input signal $S_{IN1}$, is delayed by the delay element 1950_1 for a period of time, and then the delayed input signal $S_{IND1}$ is output, so as to actuate the power gating circuit 1920_2. Therefore, the power gating circuits 1920_1 and 1920_2 will sequentially output currents to the power terminal 1911 of the logic circuit 1910, so as to provide the power required for the logic circuit 1910 to operate. In this embodiment, the operation of the power gating circuits 1920_1 and 1920_2 are similar to that of the power gating circuits 1820_1 and 1820_2 of FIG. 19A, and will not described herein again.

Figure 20:
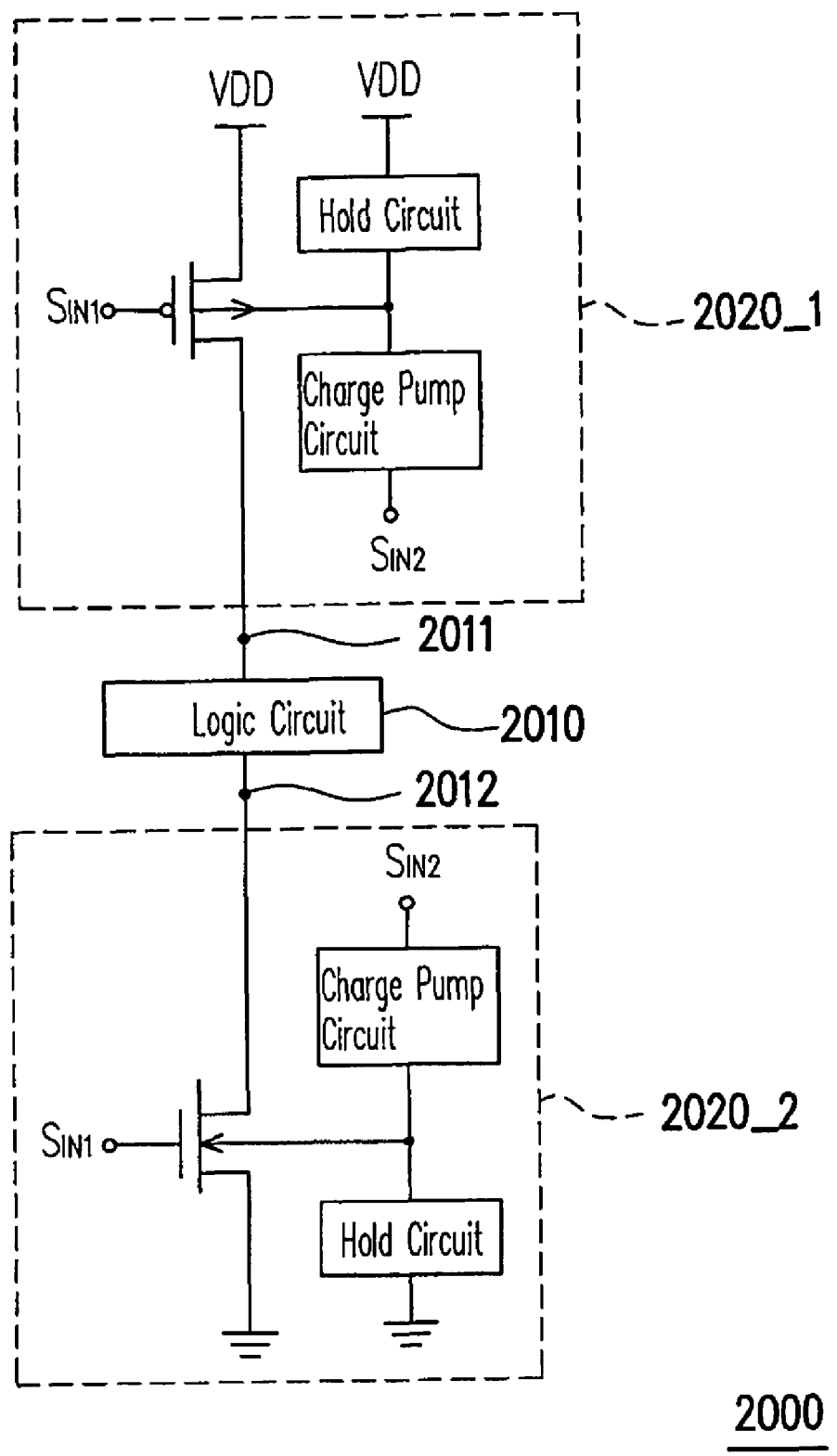
FIG. 20 is a block diagram of an SOC according to another embodiment of the present invention.

FIG. 20 is a block diagram of an SOC according to another embodiment of the present invention. Referring to FIG. 20, the SOC 2000 includes a logic circuit 2010 and power gating circuits 2020_1 and 2020_2. The logic circuit 2010 has power terminals 2011 and 2012 for receiving power required for the logic circuit 2010 to operate. The power gating circuit 2020_1 of this embodiment may be implemented with reference to FIGS. 5A, 5B, 12A to 12D or 13A to 13D, and the power gating circuit 2020_2 may be implemented with reference to FIGS. 15A, 15B, 16A to 16D or 17A to 17D, and will not be described herein again. Through the control of a first input signal $S_{IN1}$, the system voltage and the ground voltage GND are determined whether or not to pass through the power gating circuits 2020_1 and 2020_2 to be transmitted to the logic circuit 2010, thus providing the operating power required by the logic circuit 2010. Therefore, the SOC 2000 may selectively turn off the logic circuit 2010, so as to reduce the power consumption of the SOC 2000.

To sum up, the present invention uses the charge pump circuit to change the bulk voltage of the transistor of the power gating circuit, such that the transistor when being just conducted has a higher threshold voltage, thus reducing the transient current generated by the power gating circuit, and further suppressing the voltage fluctuation. Then, the hold circuit recovers the threshold voltage of the transistor to a normal value, such that the current provided by the transistor recovers to the normal value to make the SOC function normally. Therefore, the present invention can effectively lower the transient current, so as to suppress the voltage fluctuation of the entire circuit. Moreover, the power gating circuit has a simple structure, and is easy to be realized in products.

It will be apparent to persons of ordinary art in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power gating circuit, comprising:
a first transistor, having a gate terminal controlled by a first input signal, a first source/drain terminal coupled to a system voltage, and a second source/drain terminal outputting an output voltage for powering a logic circuit in accordance with the first input signal;
a charge pump circuit, directly coupled to a bulk terminal of the first transistor for pulling high a bulk voltage of the first transistor when the first input signal is pulled low, and pulling low the bulk voltage of the first transistor when the first input signal is pulled high; and
a hold circuit, coupled to the bulk terminal of the first transistor for holding the bulk voltage of the first transistor, wherein the charge pump circuit comprises a capacitor having a first terminal coupled to a second input signal, and a second terminal coupled to the bulk terminal of the first transistor, wherein the first input signal and the second input signal are always inverted with each other.

2. The power gating circuit as claimed in claim 1, further comprising an inverter having an input terminal receiving the first input signal, and an output terminal coupled to the gate terminal of the first transistor.

3. The power gating circuit as claimed in claim 1, further comprising a buffer circuit having an input terminal receiving the first input signal, and an output terminal coupled to the gate terminal of the first transistor, so as to gain the first input signal.

4. The power gating circuit as claimed in claim 1, wherein the charge pump circuit further comprises a buffer coupled between the second input signal and the first terminal of the capacitor, for gaining the second input signal.

5. The power gating circuit as claimed in claim 1, wherein the charge pump circuit further comprises an inverter coupled between the second input signal and the first terminal of the capacitor.

6. The power gating circuit as claimed in claim 1, wherein the hold circuit comprises an impedor having a first terminal coupled to the system voltage, and a second terminal coupled to the bulk terminal of the first transistor.

7. The power gating circuit as claimed in claim 1, wherein the hold circuit comprises a second transistor having a gate terminal coupled to a fourth voltage, a first source/drain terminal coupled to the system voltage, and a second source/drain terminal coupled to the bulk terminal of the first transistor.

8. A system-on-a-chip (SOC), comprising:
a logic circuit, having a power terminal for receiving power required for the logic circuit to operate; and
a power gating circuit, comprising:
a first transistor, having a gate terminal controlled by a first input signal, a first source/drain terminal coupled to a system voltage, and a second source/drain terminal coupled to the power terminal of the logic circuit;
a charge pump circuit, directly coupled to a bulk terminal of the first transistor for pulling high a bulk voltage of the first transistor when the first input signal is pulled low, and pulling low the bulk voltage of the first transistor when the first input signal is pulled high; and
a hold circuit, coupled to the bulk terminal of the first transistor for holding the bulk voltage of the first transistor, wherein the charge pump circuit comprises a capacitor having a first terminal coupled to a second input signal. and a second terminal coupled to the bulk terminal of the first transistor, wherein the first input signal and the second input signal are always inverted with each other.

9. The SOC as claimed in claim 8, wherein the power gating circuit further comprises an inverter having an input terminal receiving the first input signal, and an output terminal coupled to the gate terminal of the first transistor.

10. The SOC as claimed in claim 8, wherein the power gating circuit further comprises a buffer circuit having an input terminal receiving the first input signal, and an output terminal coupled to the gate terminal of the first transistor, so as to gain the first input signal.

11. The SOC as claimed in claim 8, wherein the charge pump circuit further comprises a buffer coupled between the second input signal and the first terminal of the capacitor, for gaining the second input signal.

12. The SOC as claimed in claim 8, wherein the charge pump circuit comprises an inverter coupled between the second input signal and the first terminal of the capacitor.

13. The SOC as claimed in claim 8, wherein the hold circuit comprises an impedor having a first terminal coupled to the system voltage, and a second terminal coupled to the bulk terminal of the first transistor.

14. The SOC as claimed in claim 8, wherein the hold circuit comprises a second transistor having a gate terminal coupled to a fourth voltage, a first source/drain terminal coupled to the system voltage, and a second source/drain terminal coupled to the bulk terminal of the first transistor.

15. The SOC as claimed in claim 8, wherein the logic circuit has a second power terminal, the SOC further comprising:
a second power gating circuit, comprising:
a ninth transistor, having a gate terminal controlled by a third input signal, a first source/drain terminal coupled to a first voltage, and a second source/drain terminal coupled to the second power terminal of the logic circuit;
a second charge pump circuit, coupled to a bulk terminal of the ninth transistor for changing a bulk voltage of the ninth transistor according to a fourth input signal; and
a second hold circuit, coupled to the bulk terminal of the ninth transistor for holding the bulk voltage of the ninth transistor.

16. The SOC as claimed in claim 8, further comprising:
a delay element, having a first input terminal for receiving the first input signal, and a second input terminal for receiving the second signal; and
a second power gating circuit, comprising:
a ninth transistor, having a gate terminal coupled to a first output terminal of the delay element, a first source/drain terminal coupled to the first voltage, and a second source/drain terminal coupled to the power terminal of the logic circuit;
a second charge pump circuit, coupled to the bulk terminal of the ninth transistor for changing the bulk voltage of the ninth transistor according to an output of a second output terminal of the delay element; and
a second hold circuit, coupled to the bulk terminal of the ninth transistor for holding the bulk voltage of the ninth transistor.

* * * * *